United States Patent
Mitsugi

(10) Patent No.: US 10,739,676 B2
(45) Date of Patent: Aug. 11, 2020

(54) ALIGNMENT MARK, IMPRINTING METHOD, AND MANUFACTURING METHOD OF SEMICONDUCTOR DEVICE

(71) Applicant: TOSHIBA MEMORY CORPORATION, Tokyo (JP)

(72) Inventor: Satoshi Mitsugi, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/351,057

(22) Filed: Mar. 12, 2019

(65) Prior Publication Data

US 2019/0369488 A1    Dec. 5, 2019

(30) Foreign Application Priority Data

Jun. 1, 2018    (JP) .................................. 2018-106107

(51) Int. Cl.
| | | |
|---|---|---|
| G03F 7/00 | (2006.01) | |
| H01L 23/544 | (2006.01) | |
| G03F 9/00 | (2006.01) | |
| H01L 21/027 | (2006.01) | |

(52) U.S. Cl.
CPC .......... *G03F 7/0002* (2013.01); *G03F 9/7076* (2013.01); *H01L 21/0274* (2013.01); *H01L 23/544* (2013.01); *H01L 2223/54426* (2013.01)

(58) Field of Classification Search
None
See application file for complete search history.

(56) References Cited

U.S. PATENT DOCUMENTS

| | | |
|---|---|---|
| 5,070,250 A | 12/1991 | Komatsu |
| 5,171,999 A | 12/1992 | Komatsu |
| 2016/0297117 A1 | 10/2016 | Sato et al. |

FOREIGN PATENT DOCUMENTS

| | | |
|---|---|---|
| JP | H3-19312 A | 1/1991 |
| JP | H3-154803 A | 7/1991 |
| JP | H5-206008 A | 8/1993 |
| JP | 2890443 B | 5/1999 |
| JP | 2004-31542 A | 1/2004 |
| JP | 2015-138963 A | 7/2015 |
| JP | 2017-92294 A | 5/2017 |
| JP | 2017-92396 A | 5/2017 |

*Primary Examiner* — Allan W. Olsen
(74) *Attorney, Agent, or Firm* — Finnegan, Henderson, Farabow, Garrett & Dunner, L.L.P.

(57) ABSTRACT

In an alignment mark of an embodiment, a first pattern has a periodic structure in a first direction on a surface of an original or a surface of a substrate and extends in a second direction, and a second pattern has a periodic structure in a third direction on the surface of the original or the surface of the substrate and extends in a fourth direction. The first direction and the third direction are parallel to each other. A period in the first direction of the periodic structure of the first pattern is equal to a period in the third direction of the periodic structure of the second pattern. At least one of the first pattern and the second pattern has a periodic structure in a fifth direction orthogonal to the first direction and the third direction on the surface of the original or the surface of the substrate. At least one of the second direction and the fourth direction is oblique with respect to the fifth direction.

20 Claims, 23 Drawing Sheets

15Ya
16.3 um
42.8 um

25Ya
13.9 um
33.8 um

SHIFT MARK AT RATE OF 40 nm IN Y DIRECTION FOR EACH 0.75 um IN X DIRECTION

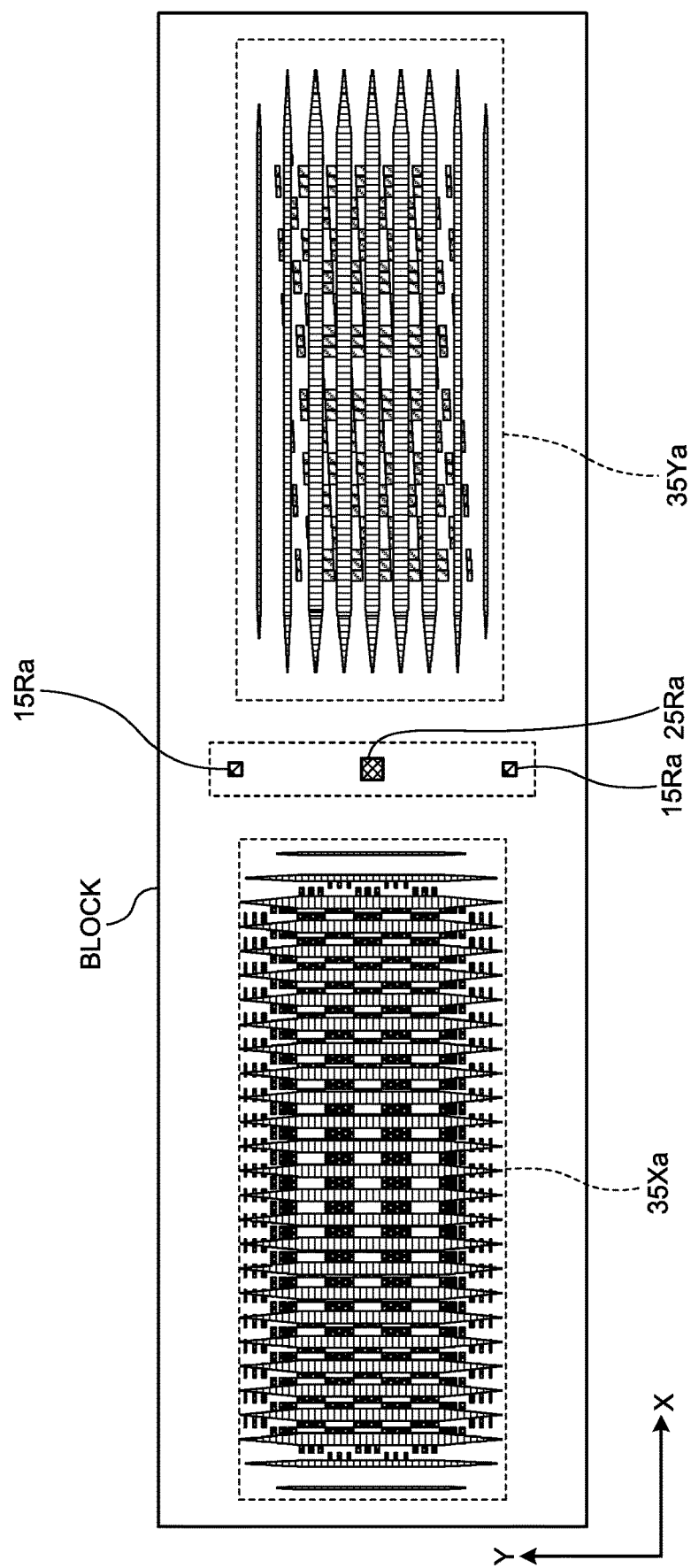

FIG.24A
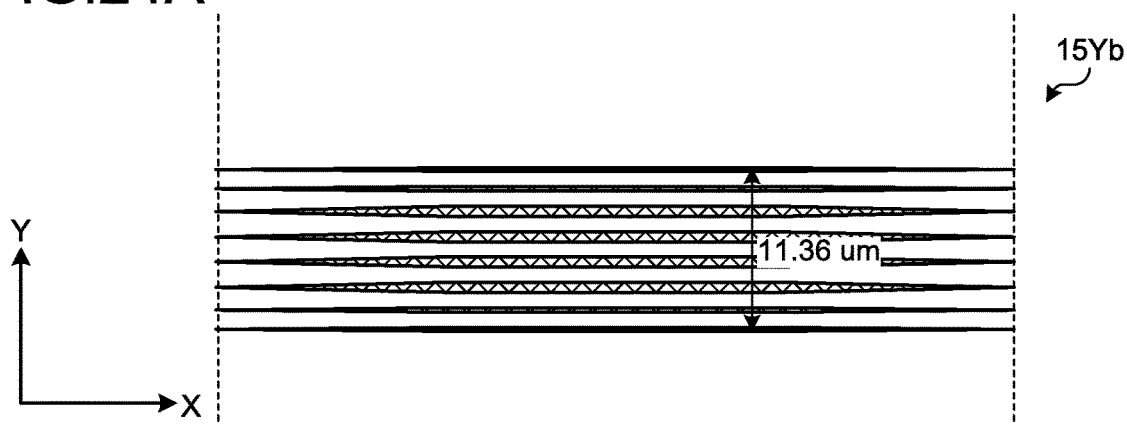
11.36 um
56.24 um
FIG.24B
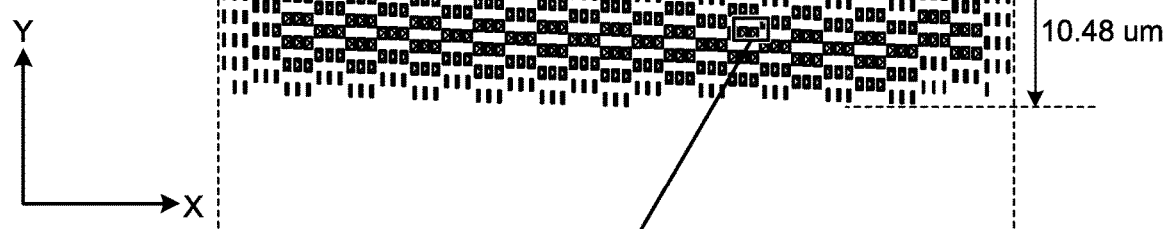
10.48 um
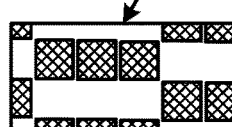
(c)
SHIFT MARK AT RATE OF 25 nm IN Y DIRECTION FOR EACH 0.75 um IN X DIRECTION
MAGNIFICATION : 750/25=30

ALIGNMENT MARK, IMPRINTING METHOD, AND MANUFACTURING METHOD OF SEMICONDUCTOR DEVICE

CROSS-REFERENCE TO RELATED APPLICATIONS

This application is based upon and claims the benefit of priority from Japanese Patent Application No. 2018-106107, filed on Jun. 1, 2018; the entire contents of which are incorporated herein by reference

FIELD

Embodiments described herein relate generally to an alignment mark, an imprinting method, and a manufacturing method of a semiconductor device.

BACKGROUND

Imprint processing, proximity exposure processing, near-field lithography processing, or the like is performed as a method of forming a fine pattern in a process of manufacturing a semiconductor device.

In such processing, an alignment process is performed between an original such as a template and a reticle and a workpiece. The alignment process is performed using, for example, alignment marks provided on the original and the workpiece, respectively.

When the alignment marks are provided on the original and the workpiece, the degree of freedom in arrangement of the alignment marks is low so that a useless area may be generated in a section where the alignment mark is arranged.

BRIEF DESCRIPTION OF THE DRAWINGS

FIG. 21 is a schematic view illustrating another example of the configuration of the moiré mark according to Example 1.

FIG. 24A is a schematic view illustrating an example of a configuration of Y marks of the template and the wafer according to Example 3;

FIG. 24B is a schematic view illustrating an example of a configuration of Y marks of the template and the wafer according to Example 3;

DETAILED DESCRIPTION

An alignment mark of an embodiment is an alignment mark having a combination of a first pattern and a second pattern, one of the patterns being provided on a surface of an original to transfer a fine pattern onto a resist on a substrate, the surface on which the fine pattern has been formed, the other pattern being provided on a surface of the substrate to which the fine pattern is transferred. When XY coordinates common to the surface of the original and the surface of the substrate are set and the original and the substrate face each other in parallel such that directions of the first pattern and the second pattern coincide with each other with respect to the XY coordinates, the first pattern has a periodic structure in a first direction on the surface of the original or the surface of the substrate and extends in a second direction. The second pattern has a periodic structure in a third direction on the surface of the original or the surface of the substrate and extends in a fourth direction. The first direction and the third direction are parallel to each other. A period in the first direction of the periodic structure of the first pattern is equal to a period in the third direction of the periodic structure of the second pattern. At least one of the first pattern and the second pattern has a periodic structure in a fifth direction orthogonal to the first direction and the third direction on the surface of the original or the surface of the substrate. At least one of the second direction and the fourth direction is oblique with respect to the fifth direction.

Hereinafter, the present invention will be described in detail with reference to the drawings. Incidentally, the present invention is not limited to the following embodiments. In addition, constituent elements in the following embodiments include those that can be easily assumed by those skilled in the art or those that are substantially the same.

[Embodiment]

An embodiment will be described with reference to FIGS. 1 to 17. An alignment mark of the embodiment is used, for example, during imprint processing. First, an imprinting apparatus that performs the imprint processing and an operation of the imprinting apparatus will be described hereinafter.

(Configuration Example of Imprinting Apparatus)

Figure 1:
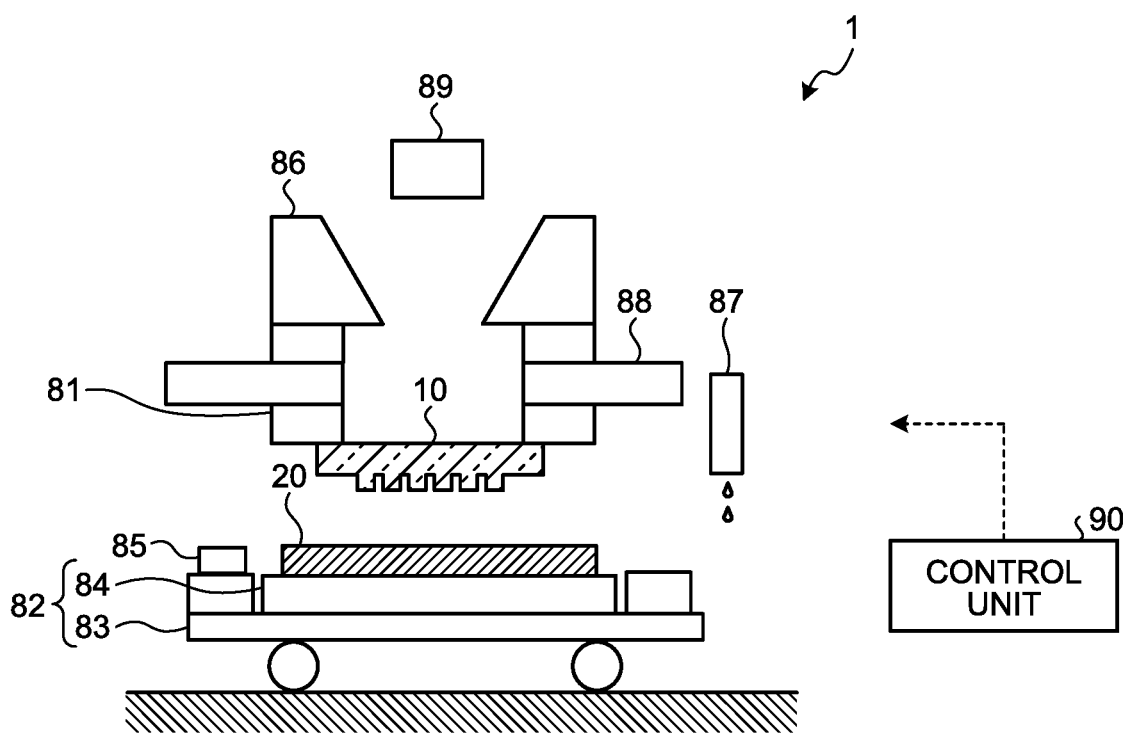
FIG. 1 is a diagram illustrating a configuration example of an imprinting apparatus according to an embodiment.

FIG. 1 is a diagram illustrating a configuration example of an imprinting apparatus 1 according to the embodiment. As illustrated in FIG. 1, the imprinting apparatus 1 includes a template stage 81, a placement table 82, a reference mark 85, an alignment sensor 86, a liquid dripping device 87, a stage base 88, a light source 89, and a control unit 90. In the imprinting apparatus 1, a template 10 to transfer a fine pattern onto a resist on a wafer 20 is installed.

The placement table 82 includes a wafer chuck 84 and a main body 83. The wafer chuck 84 fixes the wafer 20 served as a semiconductor substrate, at a predetermined position on the main body 83. The reference mark 85 is provided on the placement table 82. The reference mark 85 is used for alignment at the time of loading the wafer 20 onto the placement table 82.

The wafer 20 is placed on the placement table 82 and the placement table 82 moves within a plane (within a horizontal plane) parallel to the placed wafer 20. The placement table 82 moves the wafer 20 to a lower side of the liquid dripping device 87 when dripping a resist onto the wafer 20, and moves the wafer 20 to a lower side of the template 10 when performing transfer processing to the wafer 20.

The stage base 88 supports the template 10 by the template stage 81, and moves in the up-down direction (vertical direction) to press a fine pattern of the template 10 against the resist on the wafer 20.

An alignment sensor 86 is provided on the stage base 88. The alignment sensor 86 is a sensor that detects a position of the wafer 20 and detects a position of the template 10 based on alignment marks provided on the wafer 20 and the template 10.

The liquid dripping device 87 served as a dispenser is a device that drips a resist onto the wafer 20 by an inkjet method. An inkjet head provided in the liquid dripping device 87 has a plurality of fine holes ejecting droplets of the resist, and drips the resist droplets onto the wafer 20. Incidentally, the imprinting apparatus 1 of the embodiment is configured to drip the resist, but the resist may be applied to the entire surface of the wafer 20 by a spin coating method.

The light source 89 is, for example, a device that emits ultraviolet rays, and is provided above the stage base 88. The light source 89 emits light from an upper side of the template 10 in a state where the template 10 is pressed against the resist.

The control unit 90 controls the template stage 81, the placement table 82, the reference mark 85, the alignment sensor 86, the liquid dripping device 87, the stage base 88, and the light source 89.

(Process of Manufacturing Semiconductor Device)

Next, an example of a process of manufacturing a semiconductor device including imprint processing using the imprinting apparatus 1 of the embodiment will be described with reference to FIGS. 2A to 2E. FIGS. 2A to 2E are flowcharts illustrating an example of a procedure of the process of manufacturing the semiconductor device according to the embodiment.

Figure 2A:
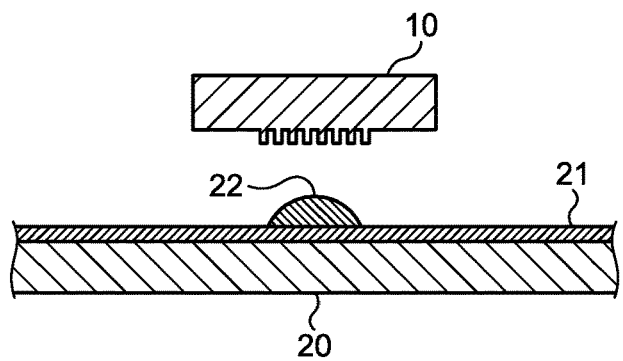
FIGS. 2A to 2E are flowcharts illustrating an example of a procedure of a process of manufacturing a semiconductor device according to the embodiment.

As illustrated in FIG. 2A, a to-be-processed film 21 is formed on the wafer 20, and a resist 22 is dripped onto the to-be-processed film 21.

Specifically, the wafer 20 on which the to-be-processed film 21 has been formed is placed on the placement table 82. Then, the placement table 82 is moved to the lower side of the liquid dripping device 87, and droplets of the resist 22 are dripped from the liquid dripping device 87 onto the to-be-processed film 21. As described above, the resist 22 may be applied to the entire surface of the wafer 20 by the spin coating method. Thereafter, the placement table 82 is moved to the lower side of the template 10.

Figure 2B:
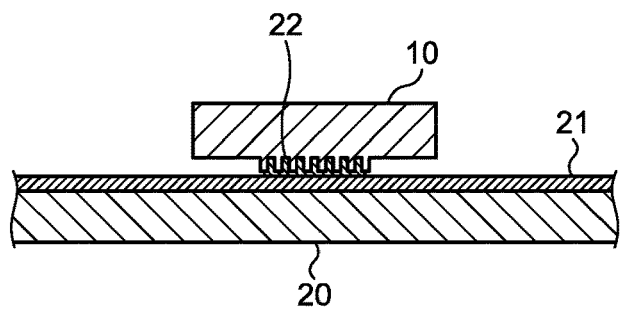

Next, as illustrated in FIG. 2B, the template stage 81 is moved downward, and the fine pattern of the template 10 is pressed against the resist 22 while performing alignment with the alignment sensor 86. Subsequently, the resist 22 is irradiated with light from the light source 89 of the imprinting apparatus 1 in a state where the template 10 is pressed, thereby curing the resist 22.

Here, the alignment using the alignment sensor 86 is performed in two stages of, for example, a rough inspection, which is rough alignment, and precise alignment. On the template 10 and the wafer 20, rough inspection marks used for the rough inspection and alignment marks used for precise alignment are formed in advance. The rough inspection is performed nondestructively at high speed by adjusting positions of the rough inspection marks between the template 10 and the wafer 20 before the template 10 and the wafer 20 come into contact with each other. However, the positional accuracy is rough since a distance between the rough inspection marks is far. The precise alignment is performed using the alignment marks of the template 10 and the wafer 20 in a state where the template 10 and the wafer 20 are brought into proximity or in contact with each other.

Figure 2C:
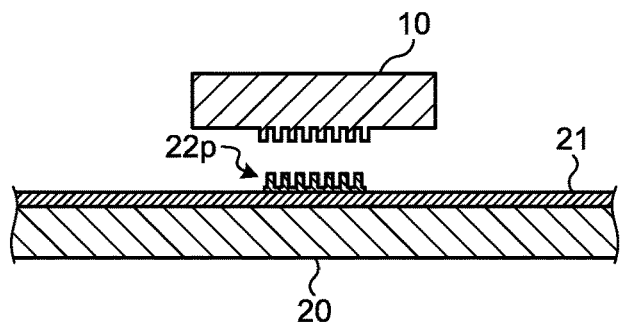

Next, as illustrated in FIG. 2C, the template 10 is released. As a result, a resist pattern 22p to which the fine pattern has been transferred is formed on the to-be-processed film 21 of the wafer 20.

Figure 2D:
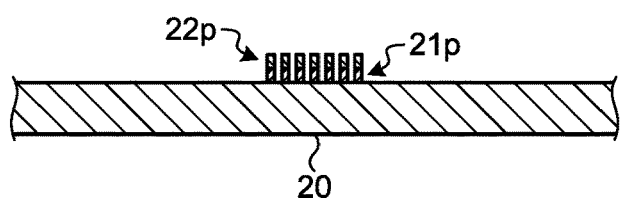

Next, as illustrated in FIG. 2D, the to-be-processed film 21 is processed using the resist pattern 22p to which the fine pattern has been transferred as a mask. As a result, a to-be-processed film pattern 21p is formed.

Figure 2E:
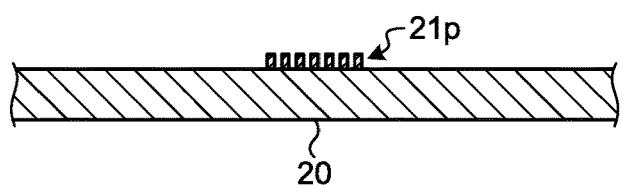

Next, as illustrated in FIG. 2E, the resist pattern 22p is peeled off by asking or the like to obtain the to-be-processed film pattern 21p formed on the wafer 20.

Thereafter, the above-described process is repeated to form a plurality of to-be-processed film patterns on the wafer 20, whereby a semiconductor device is manufactured.

(Configuration Examples of Template and Wafer)

Next, configuration examples of the template 10 and the wafer 20 of the embodiment will be described with reference to FIGS. 3A, 3B, and 4.

Figure 3A:
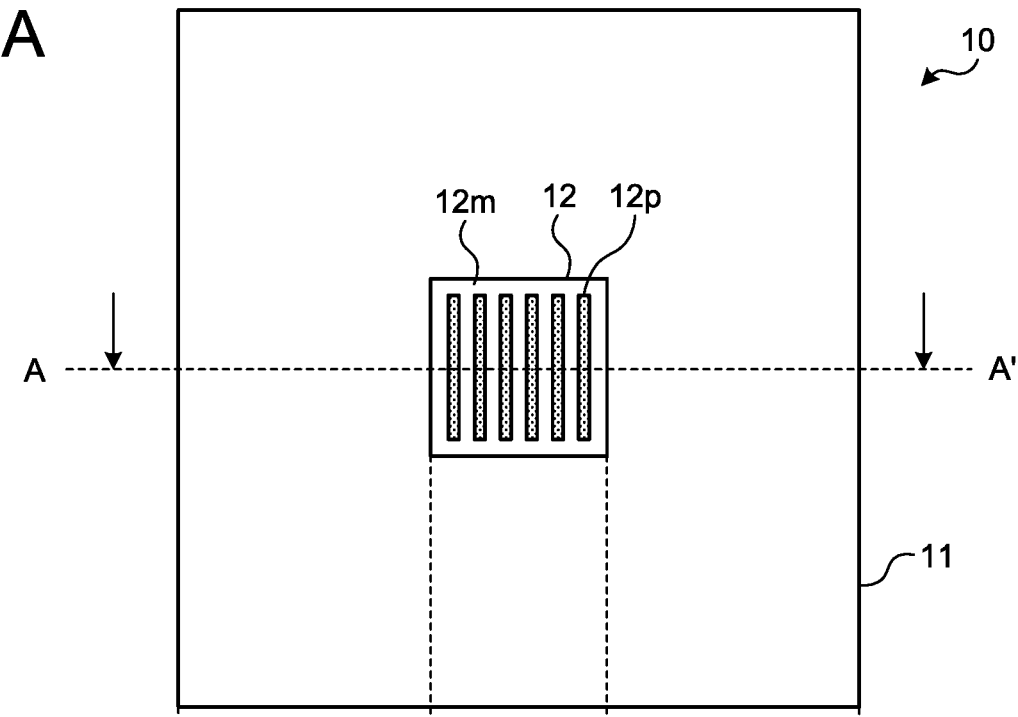
FIG. 3A is a plan view illustrating an example of a structure of a template according to the embodiment.
Figure 3B:
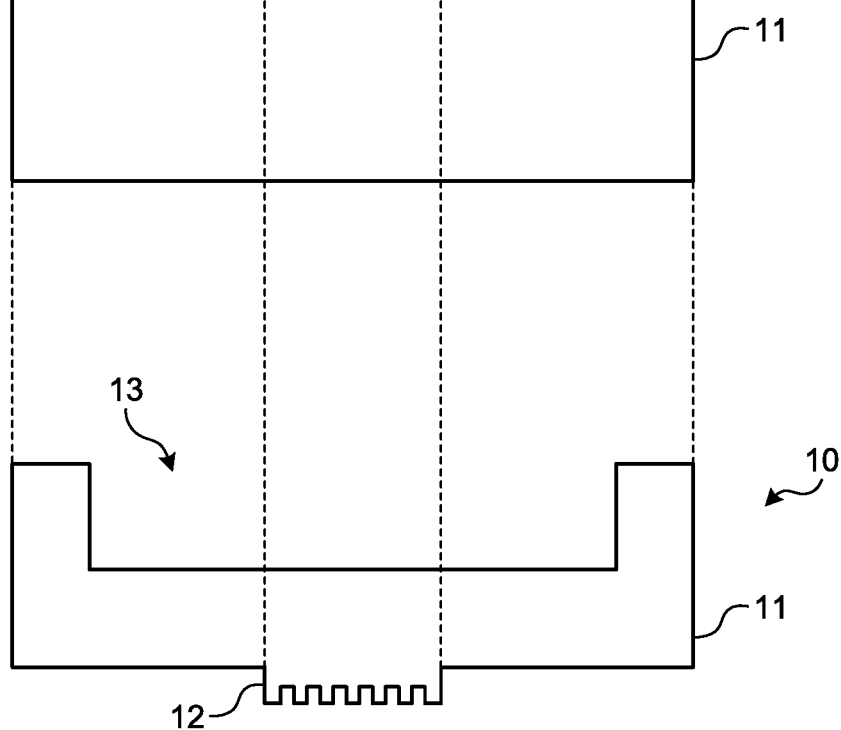
FIG. 3B is a cross-sectional view taken along line A-A' of FIG. 3A.

FIG. 3A is a plan view illustrating an example of a structure of the template 10 according to the embodiment, and FIG. 3B is a cross-sectional view taken along line A-A' of FIG. 3A. The template 10 of the embodiment is configured using a transparent member such as quartz and glass.

As illustrated in FIGS. 3A and 3B, the template 10 includes, for example, a rectangular template substrate 11. A mesa portion 12 is provided on a front surface of the template substrate 11, and a recess 13 is provided on a back surface of the template substrate 11.

The mesa portion 12 is arranged at the center portion of the template substrate 11 and has, for example, a rectangular shape. The mesa portion 12 has a pattern area 12p in which a fine pattern of a nano-order size is formed, for example. The fine pattern may be a pattern in which a plurality of dots is arranged, or another fine pattern in addition to a pattern in which a plurality of grooves is arranged as illustrated in FIGS. 2A to 2E. An outer peripheral portion of the pattern area 12p is a mark area 12m in which a rough inspection mark, an alignment mark, and the like are formed.

Figure 4:
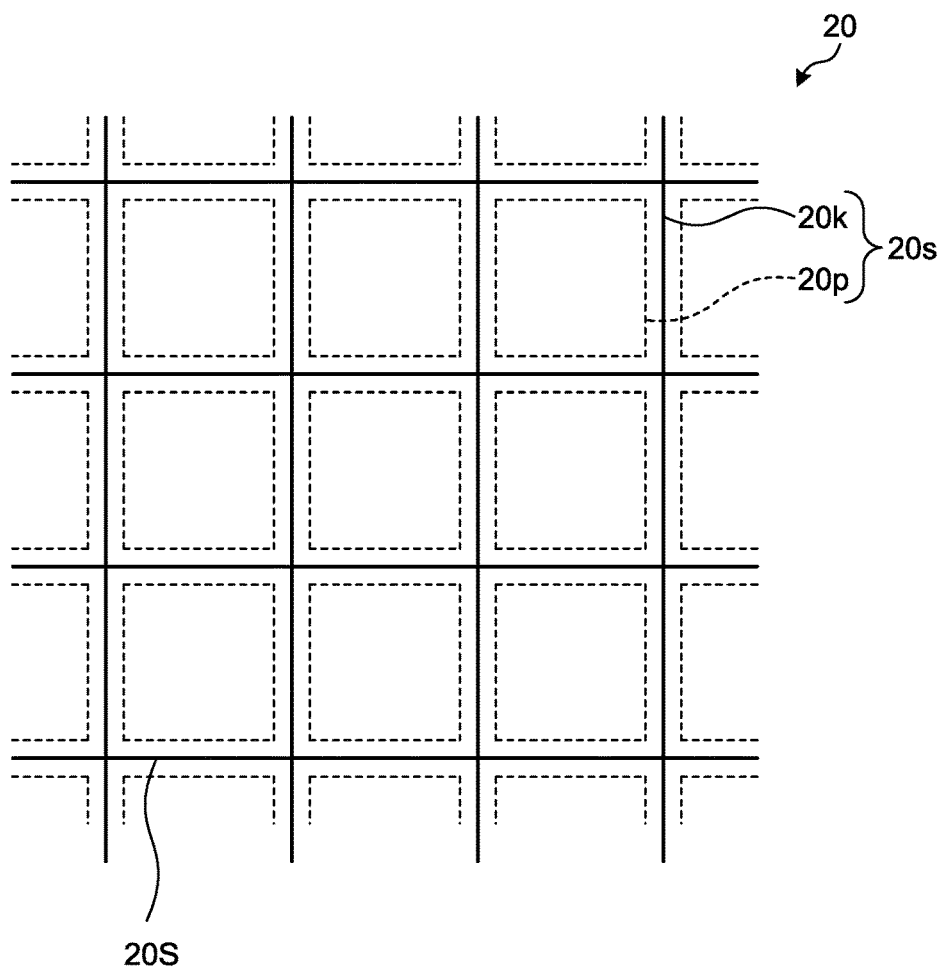
FIG. 4 is a partial plan view illustrating an example of a configuration of a shot area of a wafer according to the embodiment.

FIG. 4 is a partial plan view illustrating an example of a configuration of a shot area 20s of the wafer 20 according to the embodiment. The shot area 20s is an area to be patterned by one-time imprinting (imprinting of the template 10).

When the imprint processing with respect to the wafer 20 is completed, a plurality of the shot areas 20s is formed on the wafer 20.

The shot area 20s includes a pattern area 20p and a kerf area 20k. The pattern area 20p is an area where the fine pattern of the pattern area 12p on the template 10 is transferred to the resist as the template 10 is imprinted onto the resist on the wafer 20. The kerf area 20k is positioned at an outer peripheral portion of the pattern area 20p and corresponds to an area overlapping the mark area 12m of the template 10. In the kerf area 20k, a rough inspection mark, an alignment mark, and the like are formed in advance at positions overlapping the rough inspection mark and the alignment mark on the template 10.

(Outline of Alignment Mark)

Next, configuration examples of alignment marks of the template 10 and the wafer 20 of the embodiment will be described with reference to FIGS. 5 and 6.

There is a limitation on simple alignment using an optical system with a wavelength of several hundred nanometers although the positional accuracy required for imprint processing is the nano order. Therefore, a highly precise alignment technique using a magnification effect by a moiré image is used in the alignment mark of the embodiment. That is, positional deviation can be projected in a magnified manner by using the moiré image, and it is possible to perform the highly precise alignment. Such a moiré image can be generated, for example, by forming a periodic structure in each of the alignment marks of the template 10 and the wafer 20 and slightly varying periodic intervals.

Figure 5:
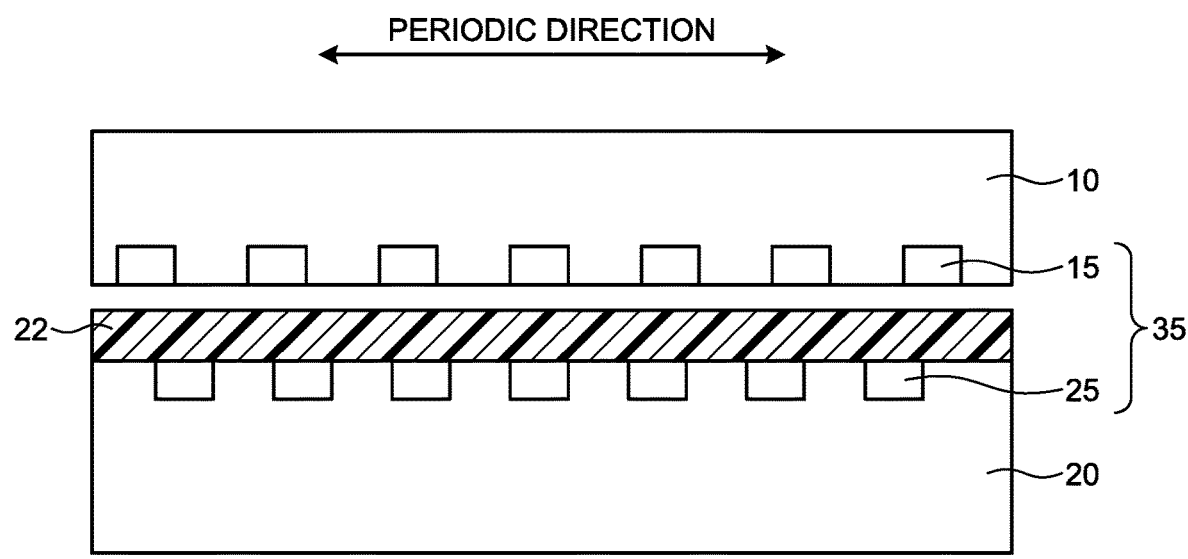
FIG. 5 is a schematic view illustrating a configuration example of alignment marks of the template and the wafer according to the embodiment.

FIG. 5 is a schematic view illustrating a configuration example of alignment marks 15 and 25 of the template 10 and the wafer 20 according to the embodiment. FIG. 5 does not illustrate the to-be-processed film 21.

As illustrated in FIG. 5, for example, the alignment mark 15 provided on the template 10 and the alignment mark 25 provided on the wafer 20 have different periods in a common periodic direction. As these alignment marks 15 and 25 overlap each other, a moiré mark 35 which generates a moiré image is formed.

In particular, the overlapping alignment marks of the template 10 and the wafer 20 are observed as the moiré mark 35 by causing an oblique incident light to be incident in a dark-field system, whereby the moiré image is observed as a microscopic image. The moiré mark 35 preferably has a high magnification ratio, a high contrast, and a high S/N ratio. The high contrast can be obtained by observation in the dark-field system, and further, the high S/N ratio can be obtained by reducing the influence of background light.

A periodic direction of the moiré image generated by the moiré mark 35 is equal to, for example, the periodic direction of the alignment marks 15 and 25. As the moiré image is observed along the periodic direction of the moiré image, it is possible to detect a positional deviation amount (displacement amount) in a predetermined direction between the template 10 and the wafer 20. The moiré mark 35 is preferably provided in each of a plurality of directions (for example, the X direction and the Y direction) such that the displacement amount can be detected in the plurality of directions.

Figure 6:
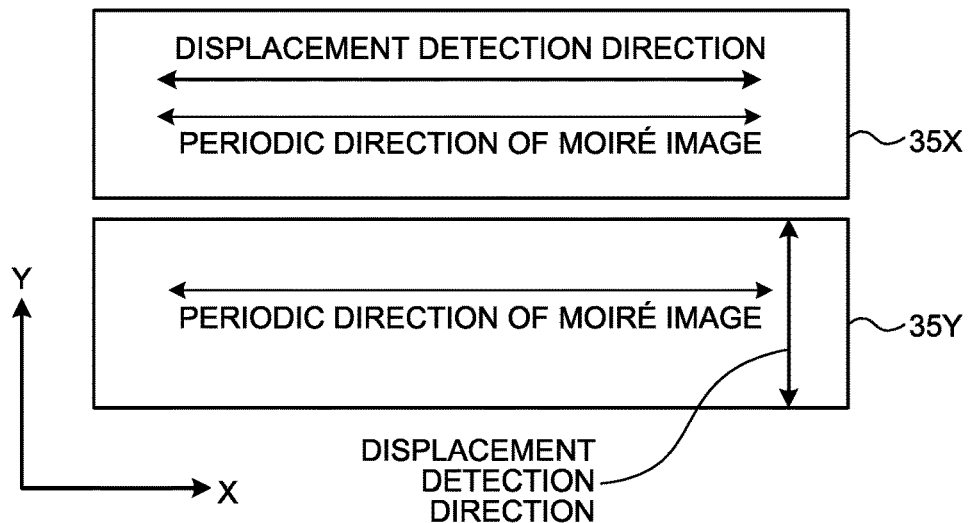
FIG. 6 is a schematic view illustrating an example of arrangement of moiré marks according to the embodiment.

FIG. 6 is a schematic view illustrating an example of arrangement of moiré marks 35X and 35Y according to the embodiment; For example, the respective moiré marks 35X and 35Y have a substantially rectangular shape and are arranged in concurrent to each other.

In the moiré mark 35X, a periodic direction of a moiré image is the X direction, and a direction in which displacement can be detected is the X direction. That is, the moiré mark 35X is configured to be capable of detecting a displacement amount in the X direction between the template 10 and the wafer 20.

In the moiré mark 35Y, a periodic direction of a moiré image is the X direction, and a direction in which displacement can be detected is the Y direction. That is, the moiré mark 35Y is configured to be capable of detecting a displacement amount in the Y direction between the template 10 and the wafer 20.

Incidentally, in the present embodiment, any of X marks 15X and 25X, and Y marks 15Y and 25Y, which are individual components of alignment marks, a moiré mark 35X in which the X marks 15X and 25X are combined, a moiré mark 35Y in which the Y marks 15Y and 25Y are combined, a combination of the X mark 15X and the Y mark 15Y, a combination of the X mark 25X and the Y mark 25Y, and the like may be sometimes referred to as an alignment mark. In addition, any of the above-described marks and combinations including a rough inspection mark may be sometimes referred to as an alignment mark.

Here, a virtual plane S used for the following description will be described with reference to FIG. 7.

Figure 7:
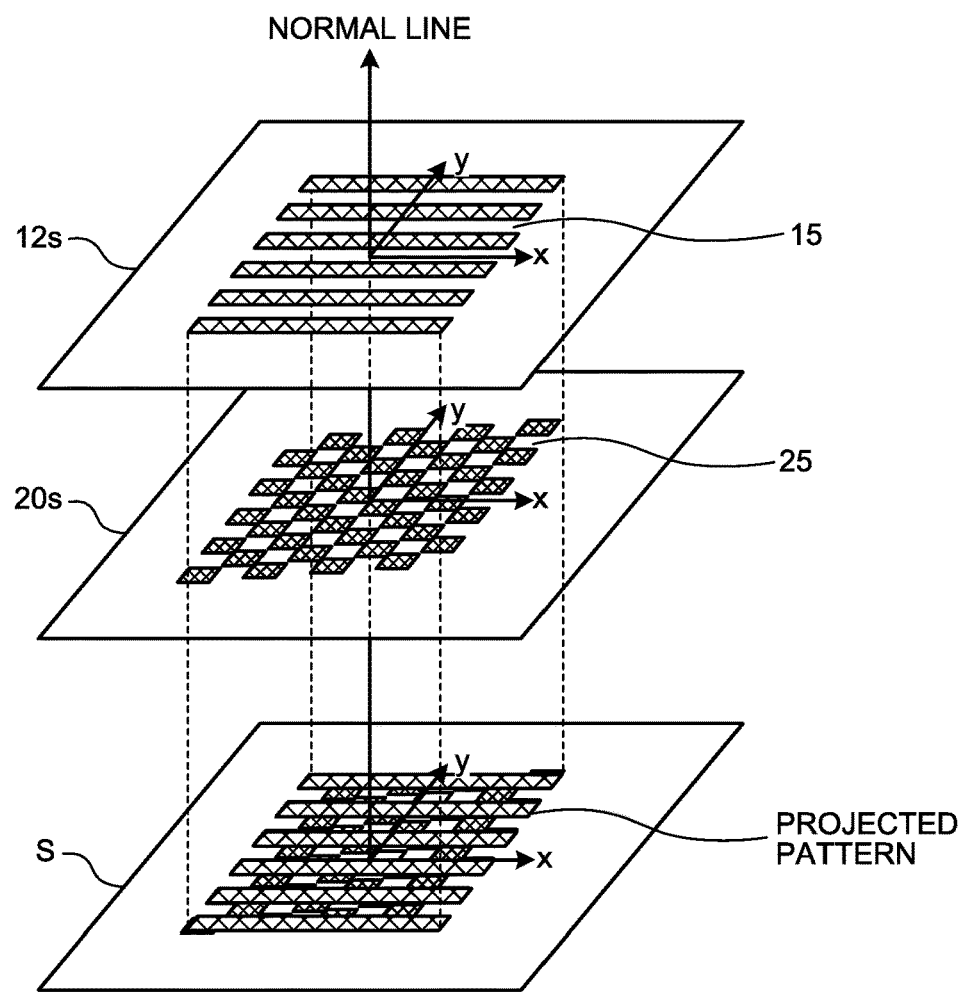
FIG. 7 is a view for describing a virtual plane used for describing the alignment mark according to the embodiment.

It is assumed that the template 10 and the wafer 20 are arranged to face each other so as to be parallel to each other as illustrated in FIG. 7. In addition, for example, XY coordinates using the pattern area 12p as a reference are set on a surface 15s of the mesa portion 12 of the template 10 provided with the alignment mark 15. In addition, for example, XY coordinates using the pattern area 20p as a reference are set on a surface 25s of the wafer 20 provided with the alignment mark 25. At this time, it is assumed that the X direction and Y direction of the template 10 are made to coincide with the X direction and Y direction of the wafer 20, the template 10 and the wafer 20 facing each other. That is, orientations of the alignment marks 15 and 25 of the template 10 and the wafer 20 coincide with each other with respect to the XY coordinates.

When the template 10 and the wafer 20 are arranged as described above, the surface 15s of the mesa portion 12 of the template 10 and the surface 25s of the wafer 20 have a common normal line. The virtual plane S parallel to the surfaces 15s and 25s is set in the common normal direction. Hereinafter, the X marks 15X and 25X, the Y marks 15Y and 25Y of the template 10 and the wafer 20, and the moiré marks 35X and 35Y where the X mark and the Y mark are combined will be described based on figures (patterns) in which the marks are projected on the virtual plane S.

(Configuration Example of X Mark)

Next, a configuration example of the X marks 15X and 25X of the embodiment will be described with reference to FIGS. 8A, 8B, 9A, and 9B.

Figure 8A:
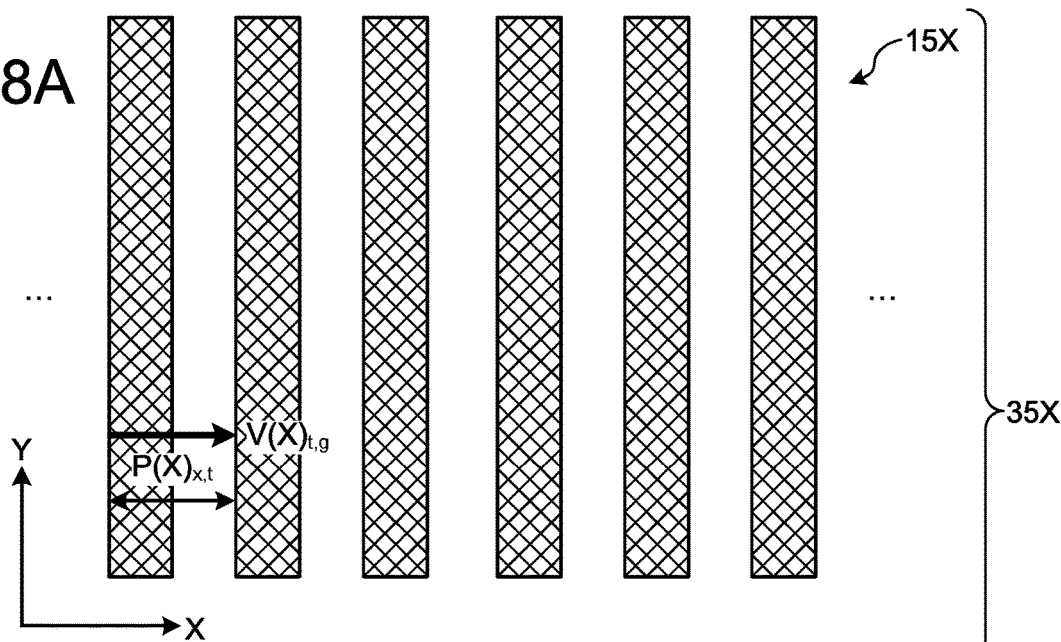
FIG. 8A is a schematic view illustrating an example of a configuration of X marks of the template and the wafer constituting a moiré mark according to the embodiment.
Figure 8B:
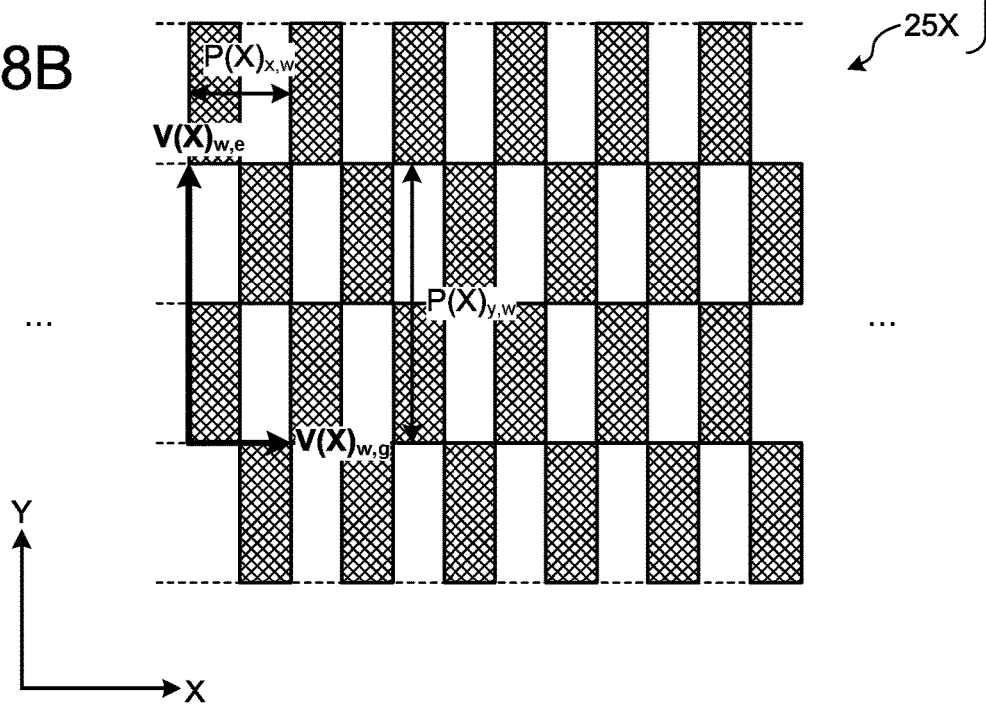
FIG. 8B is a schematic view illustrating an example of a configuration of X marks of the template and the wafer constituting a moiré mark according to the embodiment.

FIGS. 8A and 8B are schematic views illustrating examples of the configurations of the X marks 15X and 25X of the template 10 and the wafer 20 forming the moiré mark 35X according to the embodiment. FIG. 8A illustrates the X mark 15X provided on the template 10, and FIG. 8B illustrates the X mark 25X provided on the wafer 20.

In FIGS. 8A and 8B, $P(X)x,t$ is a periodic interval in the X direction of the X mark 15X, $P(X)x,w$ is a periodic interval in the X direction of the X mark 25X, and $P(X)y,w$ is a periodic interval in the Y direction of the X mark 25X. In addition, a vector $V(X)t,g$ indicates a periodic interval and a periodic direction in the X direction of the X mark 15X. In addition, a vector $V(X)w,g$ indicates a periodic interval and a periodic direction in the X direction of the X mark 25X, and a vector $V(X)w,e$ indicates a periodic interval and an extending direction in the Y direction of the X mark 25X.

As illustrated in FIGS. 8A and 8B, the X mark 15X has, for example, a one-dimensional periodic structure in a stripe shape. Such a one-dimensional periodic structure is a diffraction grating pattern in which a large number of parallel slits are arranged at equal intervals in the X direction. That is, the X mark 15X has the periodic structure in the X direction. In addition, the X mark 15X extends in the Y direction. However, the longitudinal direction of the X mark 15X is the X direction orthogonal to the extending direction.

The X mark 25X has, for example, a two-dimensional periodic structure in a checkered grating (check pattern) shape. Such a two-dimensional periodic structure is a grating pattern in which a large number of parallel slits are arranged at equal intervals in the X direction and the Y direction. That is, the X mark 25X has the periodic structure in the X direction and the Y direction. In addition, the X mark 25X extends in the Y direction. However, the longitudinal direction of the X mark 25X is the X direction orthogonal to the extending direction.

The periods of the X marks 15X and 25X in the X direction are slightly different. Thus, the two X marks 15X and 25X are overlayed on each other to form the above-described moiré mark 35X.

Figure 9A:
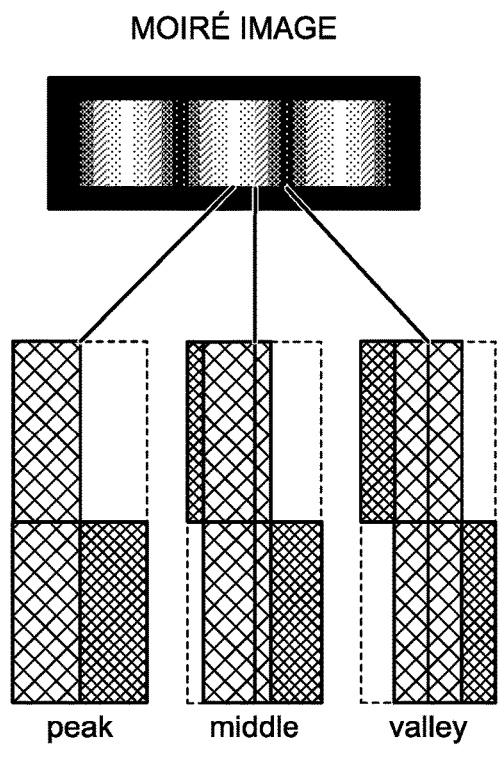
FIG. 9A is a schematic view illustrating an example of a moiré image generated by moiré marks according to the embodiment.
Figure 9B:
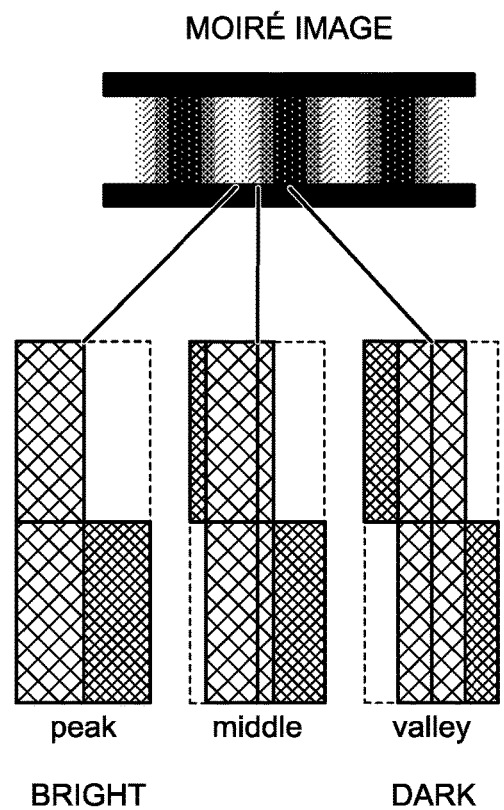
FIG. 9B is a schematic view illustrating an example of a moiré image generated by moiré marks according to the embodiment.

FIGS. 9A and 9B are schematic views illustrating examples of a moiré image generated by the moiré mark 35X according to the embodiment. Since the two X marks 15X and 25X have different periods in the X direction, a pattern deviates in the X direction by a difference $|\Delta Vg|$ between the vectors $V(X)t,g$ and $V(X)w,g$ each time the X coordinate changes by twice an average periodic interval $P(X)x,ave$.

Average Periodic Interval $P(X)x,ave=(P(X)x,t+P(X)x,w)/2$

Vector Difference $\Delta Vg=V(X)t,g-V(X)w,g$

That is, a portion where patterns overlap each other and a portion where the patterns do not overlap each other in the X direction occur in the two X marks 15X and 25X.

In the portion where the patterns overlap each other, high-order diffracted beams of light of almost all the orders are generated in the X direction and the Y direction, and these beams of light enter an observation field of view to form a bright portion. In other words, the periodic interval $P(X)x,t$ and the periodic interval $P(X)x,w$ are set such that first-order diffracted light or higher-order diffracted light of illumination light in a microscope enters an observation aperture.

On the other hand, in the portion where the patterns do not overlap each other, diffracted light in which a sum of a diffraction order in the X direction and a diffraction order in the Y direction becomes an even number is greatly suppressed, and the diffracted light hardly enters the observation field of view to form a dark portion.

In this manner, deviation in the patterns in the X direction occurs so that the moiré image in which the bright portion and the dark portion periodically appear in the X direction is obtained as illustrated in FIG. 9A. Here, when one of the X marks 15X and 25X is slightly shifted in the X direction, positions of the bright portion and the dark portion are shifted in the X direction as illustrated in FIG. 9B. At this time, a phase is displaced with a period larger than a displacement amount between actual relative positions of the X marks 15X and 25X. That is, the displacement amount in the X direction is detected in a magnified manner using the moiré image having periodicity in the X direction (see FIG. 6). The actual displacement amount between the X marks 15X and 25X can be grasped in a magnified manner due to such a magnification effect of the displacement amount using the moiré image, so that it is possible to accurately perform the alignment using the X marks 15X and 25X.

In such a moiré mark 35X, the acquisition accuracy of the displacement amount is significantly affected by a magnification ratio Mx of the displacement amount in the X direction according to the moiré image. The magnification ratio Mx of the moiré image generated by the moiré mark 35X and a periodic interval Px,m appearing in the X direction of the moiré image are obtained as follows.

Periodic Difference $\Delta P(X)x = |P(X)x,t - P(X)x,w|$ $$Mx = P(X)x, ave / \Delta P(X)x \quad (1)$$

$$Px, m = 1/2 \cdot P(X)x, ave^2 / \Delta P(X)x \quad (2)$$
$$= 1/2 \cdot Mx \cdot P(X)x, ave$$

Next, a size of the moiré mark 35X will be considered.

In the example of the embodiment, the moiré mark 35X is a checkered grating shape in which the other X mark 25X has a periodic interval P(X)y,w in the Y direction. Therefore, the moiré image returns to the original state each time the mark is shifted in the X direction by a half period. That is, it is difficult to distinguish a direction of displacement (the positive X direction or the negative X direction) with a displacement amount of ¼ period or more. Thus, if the positional accuracy (displacement amount) in the X direction in the rough inspection is $\Delta x$, the following formula needs to be established in order to perform correct position detection by the moiré mark 35X.

Average Periodic Interval $P(X)x, ave > 4\Delta x$

Due to such a restriction, there is a lower limit for the size of the moiré mark 35X (the X marks 15X and 25X). When the number of peaks (the number of periods) of a moiré image necessary to specify a phase of the moiré image generated by the moiré mark 35X and detect a displacement amount is Nm and a magnification ratio required to obtain positional accuracy is M, a lower limit of a length Lx in the X direction of the moiré mark 35X is expressed by the following formula.

$Lx > 4NmM\Delta x$

On the other hand, there is no particular limitation on a size of the moiré mark 35X in the Y direction as long as sufficient contrast can be obtained in the dark field. Thus, when the number of pattern periods in the Y direction of the moiré mark 35X is Ny, an observation wavelength of the moiré image is $\lambda$, and the number of observation apertures is NA, a lower limit of a length Ly in the Y direction of the moiré mark 35X is expressed by the following formula.

$Ly \approx NyP(X)y,w > \lambda/NA$ (Configuration Example of Y Mark)

Figure 10A:
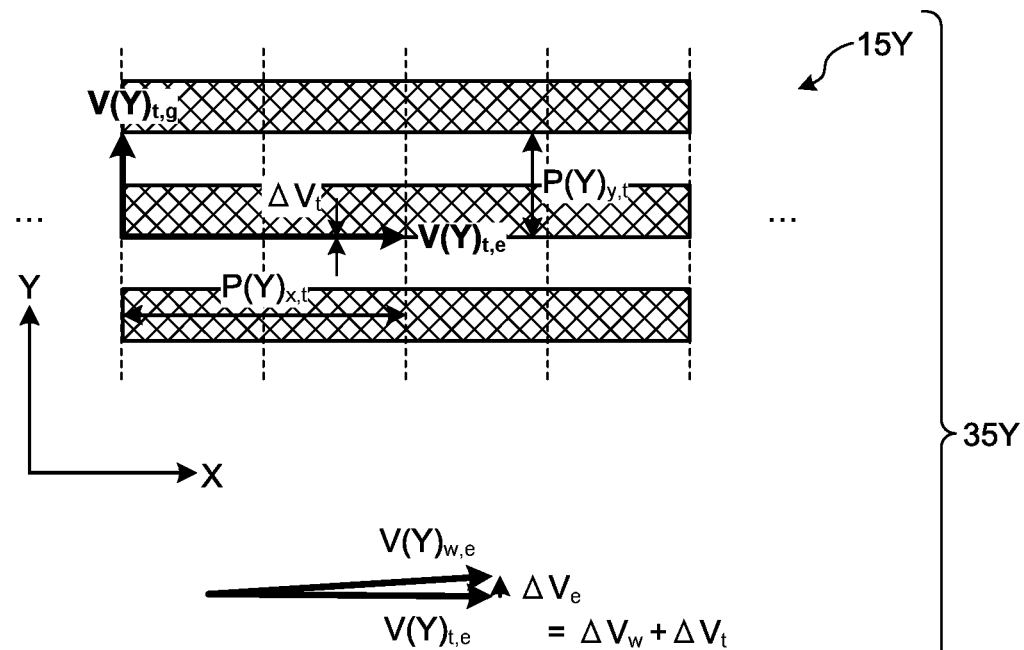
FIG. 10A is a schematic view illustrating an example of a configuration of Y marks of the template and the wafer constituting a moiré mark according to the embodiment.
Figure 10B:
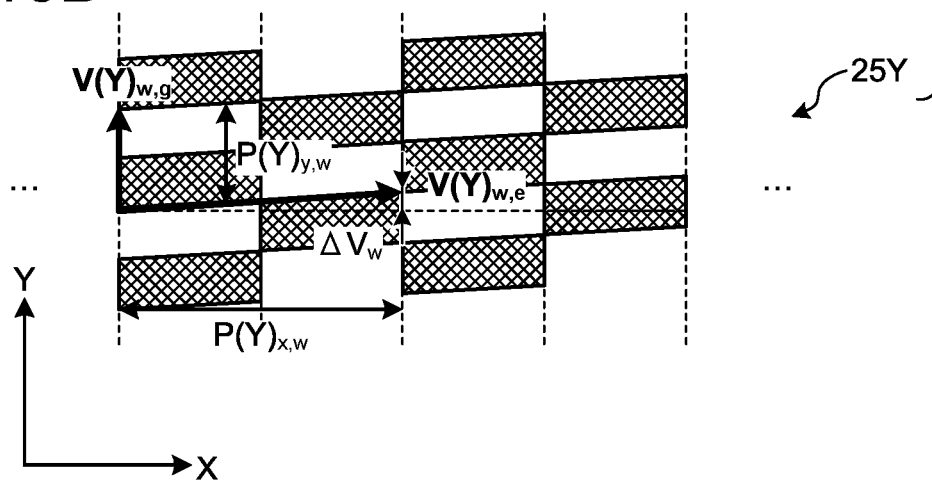
FIG. 10B is a schematic view illustrating an example of a configuration of Y marks of the template and the wafer constituting a moiré mark according to the embodiment.

Next, configuration examples of the Y marks 15Y and 25Y according to the embodiment will be described with reference to FIGS. 10A and 10B. FIGS. 10A and 10B are schematic views illustrating examples of configurations of the Y marks 15Y and 25Y of the template 10 and the wafer 20 forming the moiré mark 35Y according to the embodiment. FIG. 10A illustrates the Y mark 15Y provided on the template 10, and FIG. 10B illustrates the Y mark 25Y provided on the wafer 20.

In FIG. 10A and FIG. 10B, P(Y)x,w is a periodic interval in the X direction of the Y mark 25Y, and P(Y)y,w is a periodic interval in the Y direction of the Y mark 25Y. In addition, a vector V(Y)w,g indicates a periodic interval and a periodic direction in the Y direction of the Y mark 25Y, and a vector V(Y)w,e indicates a periodic interval and an extending direction in the X direction of the Y mark 25Y.

In addition, since the Y mark 15Y does not have periodicity in the X direction, a periodic interval P(Y)x,t in the X direction of the Y mark 15Y is defined to be the same periodic interval as the periodic interval P(Y)x,w of the Y mark 25Y. P(Y)y,t is a periodic interval in the Y direction of the Y mark 15Y. In addition, a vector V(Y)t,g indicates a periodic interval (P(Y)x, t) and a periodic direction in the Y direction of the Y mark 15Y, and a vector V(Y)t,e indicates a periodic interval and an extending direction in the X direction of the Y mark 15Y.

As illustrated in FIGS. 10A and 10B, the Y mark 15Y has, for example, a one-dimensional periodic structure in a stripe shape or the like. Such a one-dimensional periodic structure is a diffraction grating pattern in which a large number of parallel slits are arranged at equal intervals in the Y direction. That is, the Y mark 15Y has the periodic structure in the Y direction. In addition, the Y mark 15Y extends in the X direction. In addition, the longitudinal direction of the Y mark 5Y is the X direction, which is similar to the extending direction.

The Y mark 25Y has, for example, a two-dimensional periodic structure in a checkered grating shape. Such a two-dimensional periodic structure is a grating pattern in which a large number of parallel slits are arranged at equal intervals in the X direction and the Y direction. That is, the Y mark 25Y has the periodic structure in the X direction and the Y direction. In addition, the Y mark 25Y extends substantially in the X direction, but the extending direction does not completely coincide with the X direction and is slightly oblique. That is, the Y mark 25Y has a slightly extended component also in the Y direction. Incidentally, the longitudinal direction of the Y mark 25Y is the X direction.

In short, it is possible to say that $V(Y)t,g \perp V(Y)t,e$ is established, but $V(Y)w,g \perp V(Y)w,e$ is not established.

Further, the vector V(Y)t,g of the Y mark 15Y and the vector V(Y)w,g of the Y mark 25Y are equal in direction and magnitude. That is, the periodic interval P(Y)y,t in the Y direction of the Y mark 15Y is equal to the periodic interval P(Y)y,w in the Y direction of the Y mark 25Y. In addition, regarding the vector V(Y)t,e of the Y mark 15Y and the vector V(Y)w,e of the Y mark 25Y, it is defined such that the periodic interval P(Y)x,t of the Y mark 15Y is equal to the periodic interval P(Y)x,w in the X direction of the Y mark 25Y since the Y mark 15Y does not have periodicity in the X direction.

Periodic Interval $P(Y)x,t = P(Y)x,w = P(Y)x$

Periodic Interval $P(Y)y,t = P(Y)y,w = P(Y)y$

In addition, the vector V(Y)t,e of the Y mark 15Y and the vector V(Y)w,e of the Y mark 25Y intersect each other, that is, an outer product is not zero, and a vector difference between the vector V(Y)t,e and the vector V(Y)w,e is surely parallel to the Y direction in terms of the definition.

$$\text{Vector Difference } \Delta Ve = V(Y)t, e - V(Y)w, e$$
$$= \Delta Vt + \Delta Vw$$

Since each of the Y marks 15Y and 25Y is configured as above, the pattern is shifted by $|\Delta Ve|$ in the Y direction each time the X coordinate changes by the periodic interval $P(Y)x$ in the moiré mark 35Y in which the Y marks 15Y and 25Y are combined. That is, a portion where patterns overlap each other and a portion where the patterns do not overlap each other in the Y direction occur.

In the portion where the patterns overlap each other, high-order diffracted beams of light of almost all the orders are generated in the X direction and the Y direction, and these beams of light enter an observation field of view to form a bright portion. In other words, the periodic interval $P(Y)x$ is set such that first-order diffracted light or higher-order diffracted light of illumination light in a microscope enters an observation aperture.

On the other hand, in the portion where the patterns do not overlap each other, diffracted light in which a sum of a diffraction order in the X direction and a diffraction order in the Y direction becomes an even number is greatly suppressed, and the diffracted light hardly enters the observation field of view to form a dark portion.

In this manner, deviation in the patterns in the Y direction occurs so that the moiré image in which the bright portion and the dark portion periodically appear in the X direction is obtained. That is, the displacement amount in the Y direction is detected using the moiré image having periodicity in the X direction (see FIG. 6).

In the above moiré mark 35Y, a magnification ratio My of the displacement amount according to the moiré image and the periodic interval Py,m appearing in the X direction of the moiré image are obtained as follows.

$$My = P(Y)x/|\Delta Ve| \qquad (3)$$

$$Py, m = 1/2 \cdot P(Y)x \cdot P(Y)y/|\Delta Ve| \qquad (4)$$
$$= 1/2 \cdot My \cdot P(Y)y$$

From the above formula (4), it is understood that the magnification ratio My of the displacement amount according to the moiré image increases as a value of $|\Delta Ve|$ decreases. However, $V(Y)t,e \neq V(Y)w,e$ needs to be satisfied since no moiré image is generated when $|\Delta Ve|=|V(Y)t,e-V(Y)w,e|=0$.

There is a lower limit for a size of the moiré mark 35Y (the Y marks 15Y and 25Y). The lower limit is substantially the same as the lower limit for the size of the moiré mark 35X (the X marks 15X and 25X).

(Comparative Example)

Next, an alignment mark of Comparative Example 1 will be described with reference to FIG. 11. The alignment mark of Comparative Example 1 is formed of, for example, an X mark and a Y mark provided on a template, and an X mark and a Y mark provided on a wafer.

The X mark of the template has a one-dimensional periodic structure in a stripe shape having periodicity in the X direction. The X mark of the wafer has a two-dimensional periodic structure in a checkered grating shape having periodicity in the X direction and the Y direction. The X marks of the template and the wafer are configured to have slightly different periodic intervals in the X direction.

Figure 11:
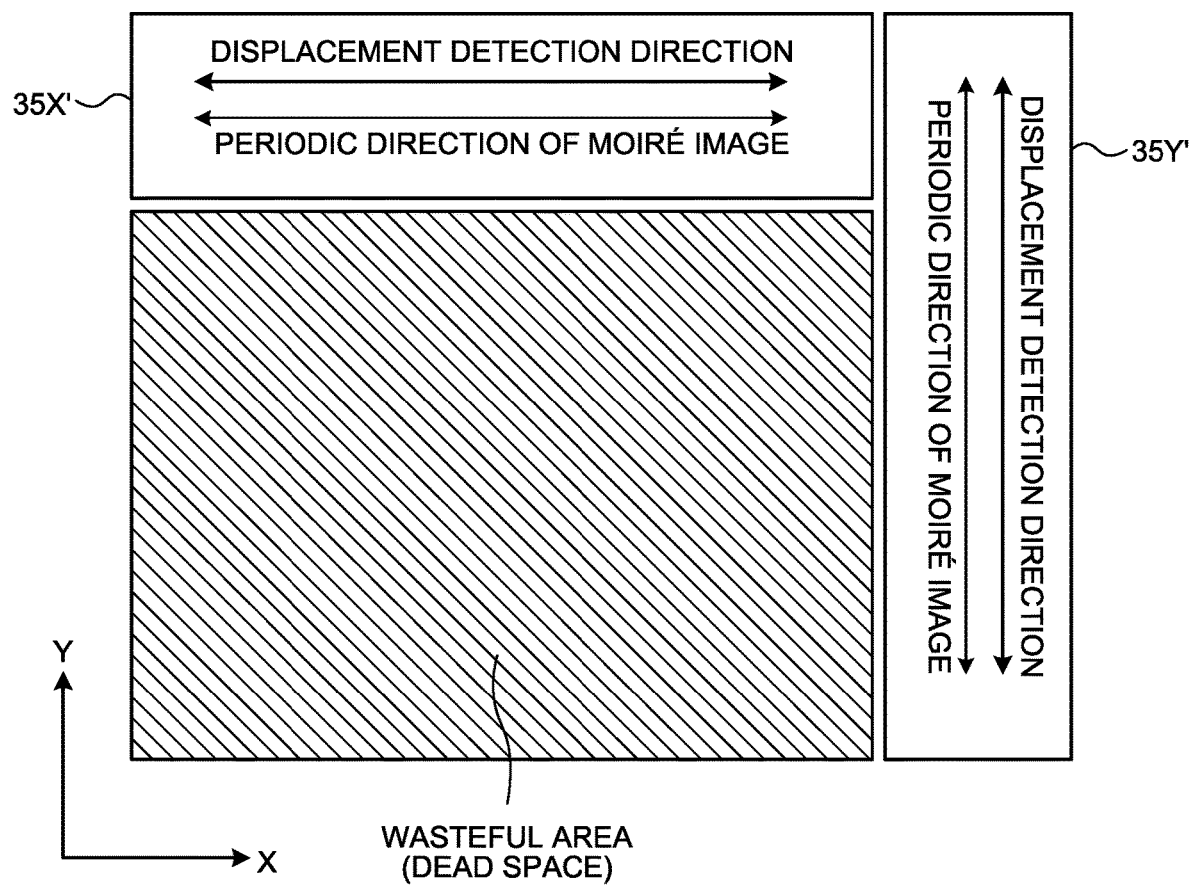
FIG. 11 is a schematic view illustrating an example of arrangement of moiré marks according to Comparative Example 1.

As illustrated in FIG. 11, a moiré mark 35X' capable of detecting a displacement amount in the X direction can be obtained by combining the above X marks of the template and the wafer. In the moiré mark 35X', a periodic direction of a moiré image is the X direction, and a direction in which displacement can be detected is the X direction.

The Y marks of the template and the wafer are obtained by rotating the X marks of the template and the wafer, respectively, by 90°. That is, the Y mark of the template has a one-dimensional periodic structure in a stripe shape having periodicity in the Y direction. The Y mark of the wafer has a two-dimensional periodic structure in a checkered grating shape having periodicity in the X direction and the Y direction. The Y marks of the template and the wafer are configured to have slightly different periodic intervals in the Y direction.

As illustrated in FIG. 11, a moiré mark 35Y' capable of detecting a displacement amount in the Y direction can be obtained by combining the above Y marks of the template and the wafer. In the moiré mark 35Y', a periodic direction of a moiré image is the Y direction, and a direction in which displacement can be detected is the Y direction.

Here, there is a lower limit for sizes of the moiré marks 35X' and 35Y'. As an example, when it is assumed that a positional accuracy $\Delta x$ in the X direction in rough inspection is 0.3 μm, a magnification ratio Mx of a displacement amount in the X direction according to a moiré image is 20, and the number of periods of the moiré image necessary for acquisition of the displacement amount needs to be three, a lower limit of a length Lx of the moiré mark 35X' in the X direction is calculated as follows.

$$P(X)x, ave > 1.2 \text{ μm}$$

$$Lx = 3Px, m > 72 \text{ μm}$$

On the other hand, when a periodic interval $P(X)y,w$ in the Y direction is 4 μm and the number Ny of pattern periods in the Y direction is five, a lower limit of a length Ly of the moiré mark 35X' in the Y direction is calculated as follows.

$$Ly = 20 \text{ μm}$$

Similarly, lower limits of lengths Lx and Ly in the X direction and the Y direction of the moiré mark 35Y' are calculated as follows.

$$Lx = 20 \text{ μm}$$

$$Ly > 72 \text{ μm}$$

Therefore, the moiré marks 35X' and 35Y' are arranged to be rotated by 90° with each other as illustrated in FIG. 11, and the block area of the alignment mark is 6624 μm² (=(72+20)×72) although the area occupied by the moiré marks 35X' and 35Y' is 2880 μm² (=72×20×2). However, mixing other configurations in a vacant wasted area is not preferable because it is difficult to distinguish the moiré marks 35X' and 35Y'.

In the moiré marks 35X and 35Y according to the embodiment, it is possible to detect either the displacement amount in the X direction or the displacement amount in the Y direction with the moiré image having periodicity in the X direction. Therefore, the block area of the alignment mark can be made substantially equal to the area occupied by the moiré marks 35X and 35Y. In other words, both the area occupied by the moiré marks 35X and 35Y and the block area of the alignment mark are theoretically 2LxLy.

As a result, the block area of the alignment mark can be made smaller than the block area of Comparative Example 1. Therefore, it is possible to effectively use a die as arrangement becomes possible in an excess space of which area is insufficient to arrange the alignment mark of Comparative Example 1.

In addition, it is possible to enhance the degree of freedom in arrangement of the alignment mark as the moiré marks 35X and 35Y can be arranged in concurrent, for example.

(First Modification)

Figure 12A:
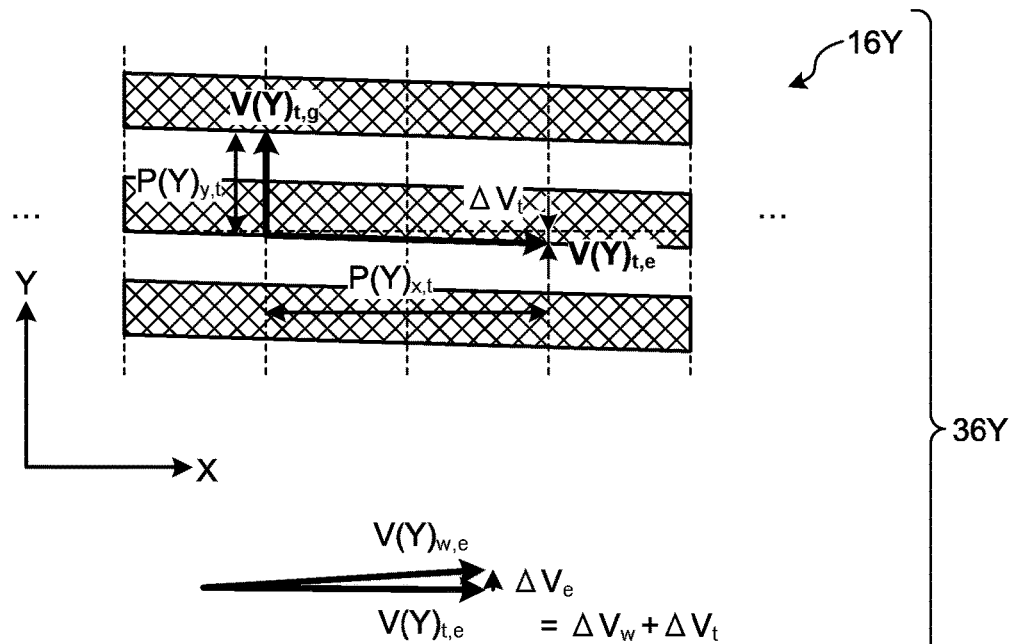
FIG. 12A is a schematic view illustrating an example of a configuration of Y marks of a template and a wafer constituting a moiré mark according to a first modification of the embodiment.
Figure 12B:
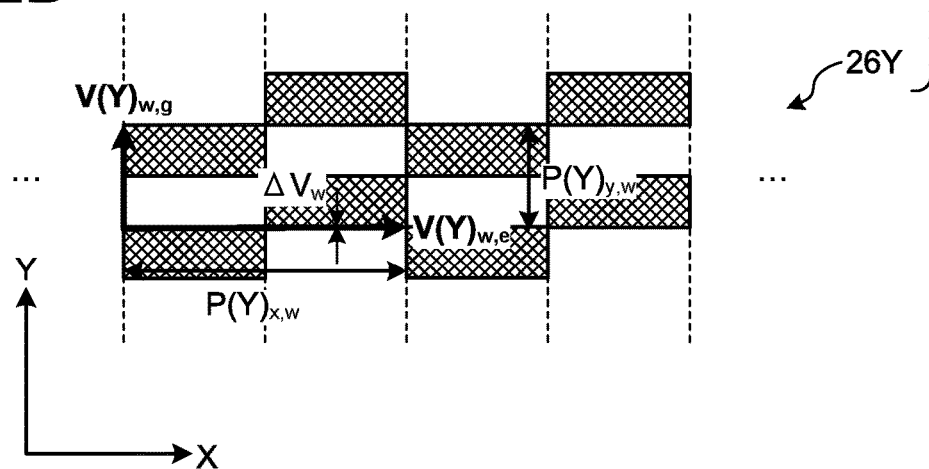
FIG. 12B is a schematic view illustrating an example of a configuration of Y marks of a template and a wafer constituting a moiré mark according to the first modification of the embodiment.

Next, an alignment mark of a first modification of the embodiment will be described with reference to FIGS. 12A and 12B. FIGS. 12A and 12B are schematic views illustrating examples of configurations of Y marks 16Y and 26Y of a template and a wafer forming a moiré mark 36Y according to the first modification of the embodiment. FIG. 12A illustrates the Y mark 16Y provided on the template, and FIG. 12B illustrates the Y mark 26Y provided on the wafer. The Y mark 16Y not on the wafer side but on the template side is oblique in the alignment mark of the first modification of the embodiment, which is different from the above embodiment.

As illustrated in FIGS. 12A and 12B, the Y mark 16Y has a one-dimensional periodic structure in a stripe shape, for example. Such a one-dimensional periodic structure is a diffraction grating pattern in which a large number of parallel slits are arranged at equal intervals in the Y direction. That is, the Y mark 16Y has the periodic structure in the Y direction. Although the Y mark 16Y extends substantially in the X direction, but the extending direction does not completely coincide with the X direction and is slightly oblique. That is, the Y mark 16Y has a slightly extended component also in the Y direction. Incidentally, the longitudinal direction of the Y mark 16Y is the X direction.

The Y mark 26Y has, for example, a two-dimensional periodic structure in a checkered grating shape. Such a two-dimensional periodic structure is a grating pattern in which a large number of parallel slits are arranged at equal intervals in the X direction and the Y direction. That is, the Y mark 26Y has the periodic structure in the X direction and the Y direction. In addition, the Y mark 26Y extends in the X direction. In addition, the longitudinal direction of the Y mark 26Y is the X direction, which is similar to the extending direction.

In short, it is possible to say that $V(Y)w,g \perp V(Y)w,e$ is established, but $V(Y)t,g \perp V(Y)t,e$ is not established. However, $V(Y)t,e \neq V(Y)w,e$ needs to be satisfied in order to generate a moiré image.

As the Y marks 16Y and 26Y are configured in the above-described manner, a pattern deviation occurs in the Y direction, and a moiré image in which a bright portion and a dark portion appear periodically in the X direction is obtained. That is, a displacement amount in the Y direction is detected using the moiré image having periodicity in the X direction.

In the above moiré mark 36X, a magnification ratio My of the displacement amount according to the moiré image and a periodic interval Py,m of the moiré image are obtained as the above Formulas (3) and (4). In addition, there is a lower limit for a size of the moiré mark 36Y (the Y marks 16Y and 26Y). The lower limit is substantially the same as the lower limit of the size of the moiré mark 35Y (the Y marks 15Y and 25Y) of the embodiment.

(Second Modification)

Figure 13A:
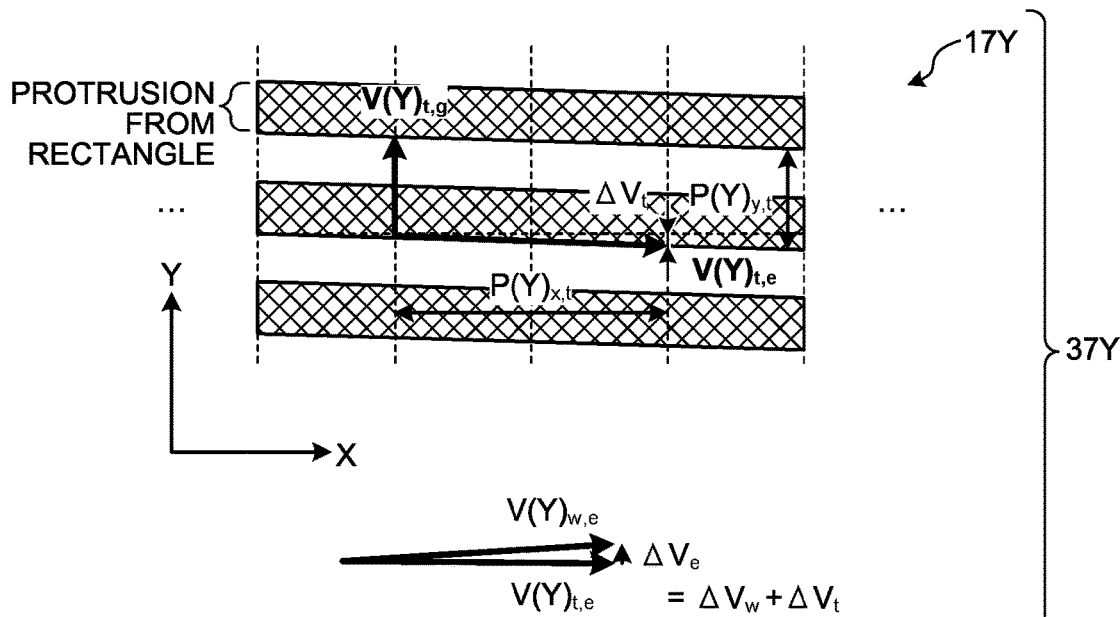
FIG. 13A is a schematic view illustrating an example of a configuration of Y marks of a template and a wafer constituting a moiré mark according to a second modification of the embodiment.
Figure 13B:
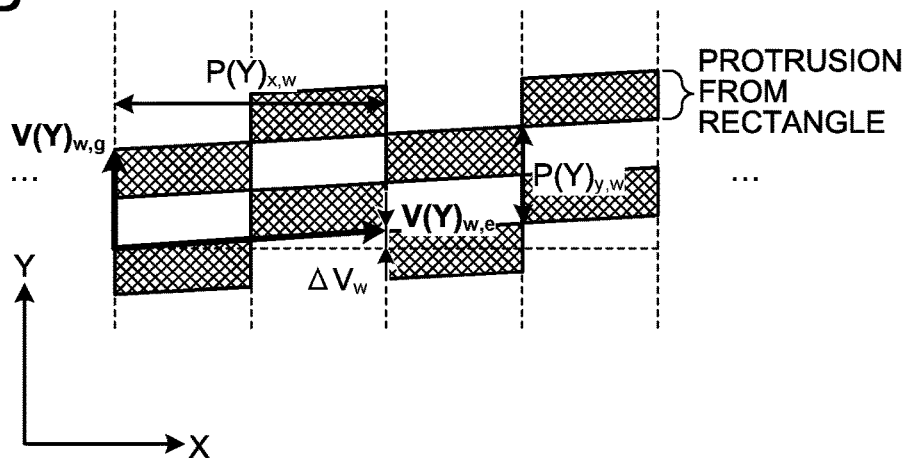
FIG. 13B is a schematic view illustrating an example of a configuration of Y marks of a template and a wafer constituting a moiré mark according to the second modification of the embodiment.

Next, an alignment mark according to a second modification of the embodiment will be described with reference to FIGS. 13A and 13B. FIGS. 13A and 13B are schematic views illustrating examples of configurations of Y marks 17Y and 27Y of a template and a wafer forming a moiré mark 37Y according to the second modification of the embodiment. FIG. 13A illustrates the Y mark 17Y provided on the template, and FIG. 13B illustrates the Y mark 27Y provided on the wafer. Both the Y marks 17Y and 27Y are oblique in the alignment mark of the second modification of the embodiment, which is different from the above embodiment.

As illustrated in FIGS. 13A and 13B, the Y mark 17Y has a one-dimensional periodic structure in a stripe shape, for example. Such a one-dimensional periodic structure is a diffraction grating pattern in which a large number of parallel slits are arranged at equal intervals in the Y direction. That is, the Y mark 17Y has the periodic structure in the Y direction. Although the Y mark 17Y extends substantially in the X direction, but the extending direction does not completely coincide with the X direction and is slightly oblique. That is, the Y mark 17Y has a slightly extended component also in the Y direction. Incidentally, the longitudinal direction of the Y mark 17Y is the X direction.

The Y mark 27Y has, for example, a two-dimensional periodic structure in a checkered grating shape. Such a two-dimensional periodic structure is a grating pattern in which a large number of parallel slits are arranged at equal intervals in the X direction and the Y direction. That is, the Y mark 27Y has the periodic structure in the X direction and the Y direction. Although the Y mark 27Y extends substantially in the X direction, but the extending direction does not completely coincide with the X direction and is slightly oblique. That is, the Y mark 27Y has a slightly extended component also in the Y direction. Incidentally, the longitudinal direction of the Y mark 27Y is the X direction.

In short, it is possible to say that $V(Y)t,g \perp V(Y)t,e$ is not established and $V(Y)w,g \perp V(Y)w,e$ is not established. However, $V(Y)t,e \neq V(Y)w,e$ needs to be satisfied. In addition, oblique directions of the Y marks 17Y and 27Y are preferably opposite to each other, and more preferably $|V(Y)t,e|=|V(Y)w,e|$. When the above Y marks 17Y and 27Y are actually applied, a protrusion from a rectangular shape caused by the obliqueness is appropriately omitted. Therefore, it is possible to suppress the protrusion from the rectangular shape caused by the obliqueness and to suppress a size increase in the Y direction at the minimum by defining the oblique directions and the vectors as described above.

As the Y marks 17Y and 27Y are configured in the above-described manner, a pattern deviation occurs in the Y direction, and a moiré image in which a bright portion and a dark portion appear periodically in the X direction is obtained. That is, a displacement amount in the Y direction is detected using the moiré image having periodicity in the X direction.

In the above moiré mark 37X, a magnification ratio My of the displacement amount according to the moiré image and a periodic interval Py,m of the moiré image are obtained as the above Formulas (3) and (4). In addition, there is a lower limit for a size of the moiré mark 37Y (the Y marks 17Y and 27Y). The lower limit is substantially the same as the lower limit of the size of the moiré mark 35Y (the Y marks 15Y and 25Y) of the embodiment.

(Third Modification)

Figure 14:
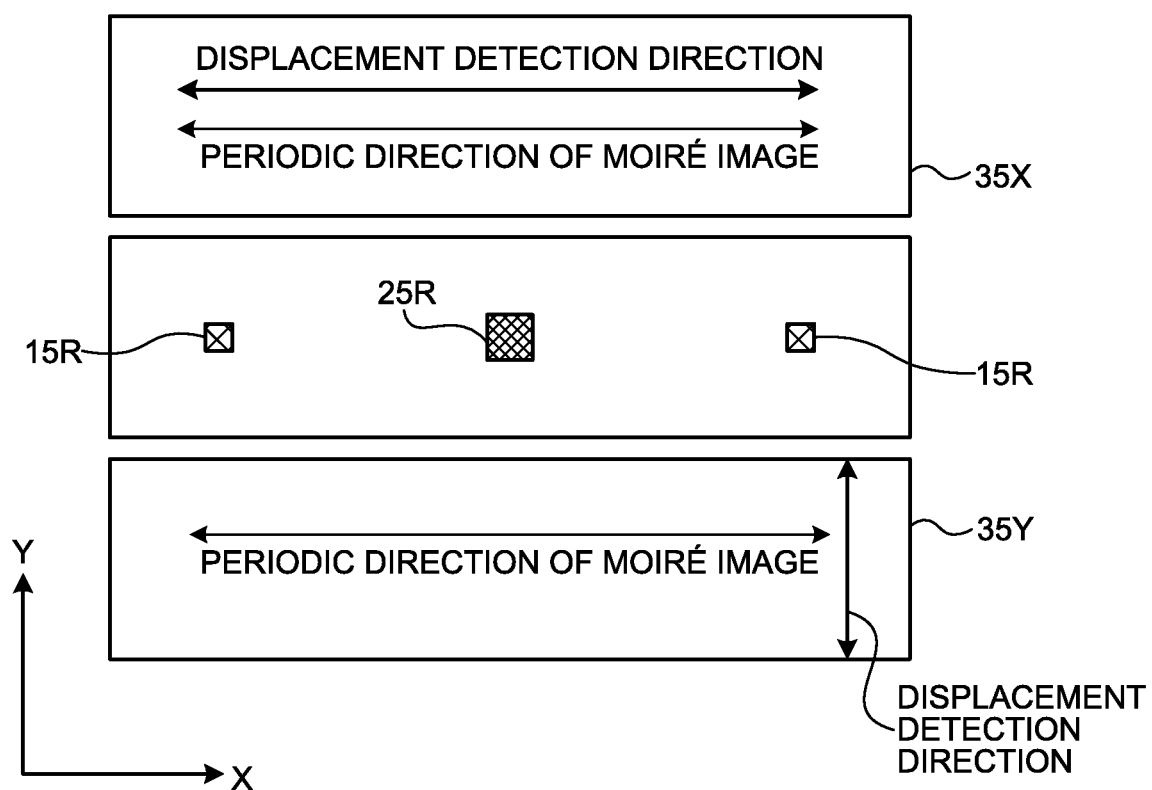
FIG. 14 is a schematic view illustrating an example of arrangement of moiré marks according to a third modification of the embodiment.

Next, arrangement of alignment marks according to a third modification of the embodiment will be described with reference to FIG. 14. FIG. 14 is a schematic view illustrating an example of arrangement of the moiré marks 35X and 35Y according to the third modification of the embodiment. The moiré marks 35X and 35Y according to the third modification of the embodiment are combined with rough inspection marks 15R and 25R, which is different from the above embodiment.

As illustrated in FIG. 14, directions of displacement of moiré images are equal in the moiré marks 35X and 35Y. Therefore, it is also possible to arrange the moiré marks 35X, 35Y in combination with, for example, the rough inspection marks 15R and 25R. The rough inspection marks 15R and 25R are configured such that alignment in both the X direction and the Y direction is possible.

Specifically, the rough inspection mark 15R is provided on the template, and the rough inspection mark 25R is provided on the wafer. In the example of FIG. 14, the two rough inspection marks 15R and the one rough inspection mark 25R are arranged so as to be aligned on the same line in the rough inspection, thereby performing the alignment in the Y direction. In addition, the rough inspection marks 25R and each of the two rough inspection marks 15R are arranged so as to have an equal distance therebetween, thereby performing the alignment in the X direction.

Although FIG. 14 illustrates an example in which the moiré mark 35X, the rough inspection marks 15R and 25R, and the moiré mark 35Y are arranged in concurrent in this order, the embodiment is not limited thereto. For example, the rough inspection marks 15R and 25R may be rotated by 90° and arranged so as to be adjacent to end portions in the X direction of the moiré marks 35X and 35Y which are arranged in concurrent.

Although the example of FIG. 14 illustrates the moiré marks 35X and 35Y, the other moiré mark 36Y or 37Y, or the like may be used instead of the moiré mark 35Y.

(Fourth Modification)

Figure 15A:
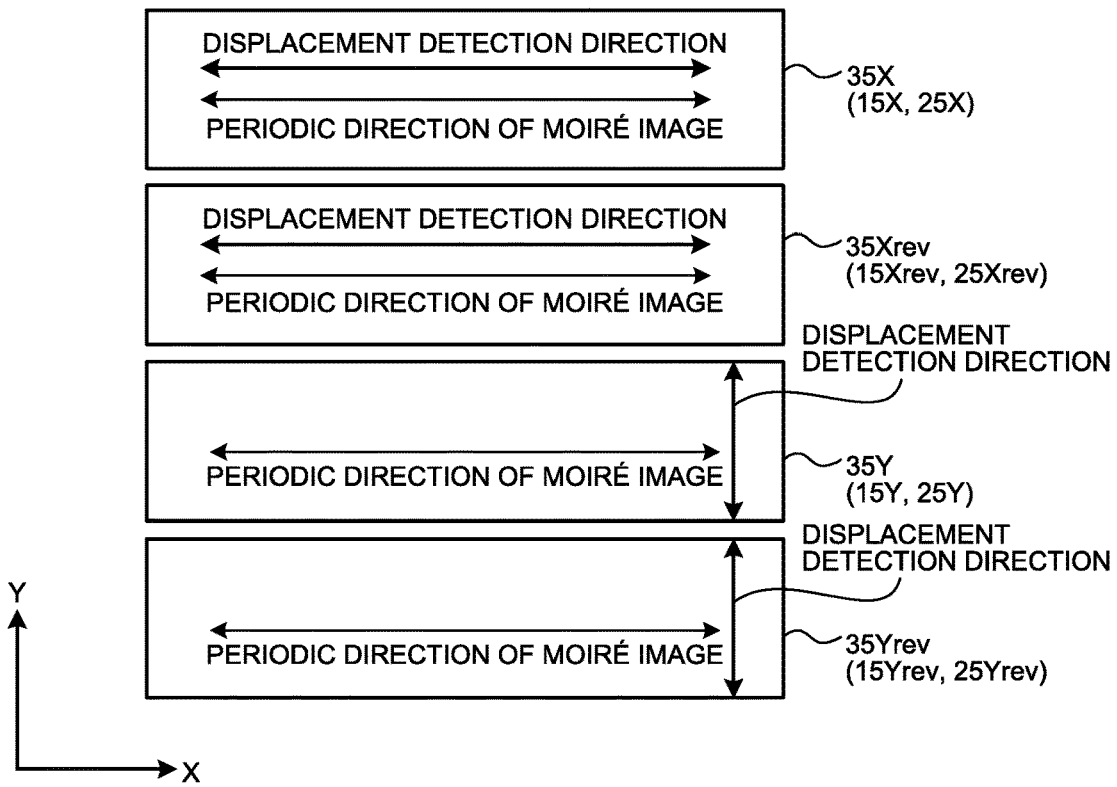
FIG. 15A is a schematic view illustrating an example of arrangement of moiré marks according to a fourth modification of the embodiment.
Figure 15B:
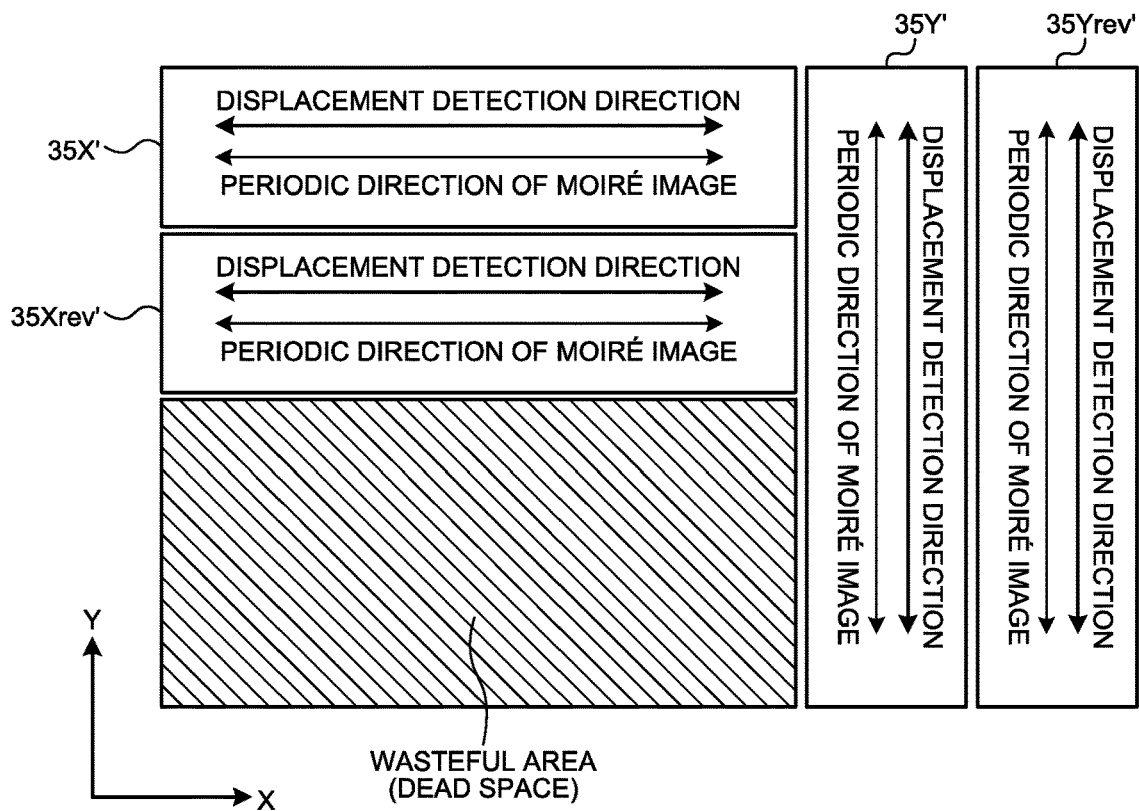
FIG. 15B is a schematic view illustrating an example of arrangement of moiré marks according to Comparative Example 2.

Next, arrangement of alignment marks according to a fourth modification of the embodiment will be described with reference to FIGS. 15A and 15B. FIG. 15A is a schematic view illustrating an example of arrangement of moiré marks 35X, 35Xrev, 35Y, and 35Yrev according to the fourth modification of the embodiment, and FIG. 15B is a schematic view illustrating arrangement of moiré marks 35X', 35Xrev', 35Y', and 35Yrev' according to Comparative Example 2. The moiré marks 35X, 35Xrev, 35Y, and 35Yrev according to the fourth modification of the embodiment are differential moiré marks, which is different from the above embodiment.

As illustrated in FIG. 15A, the moiré marks 35X, 35Xrev, 35Y, and 35Yrev according to the fourth modification of the embodiment are arranged in concurrent with each other.

The moiré mark 35Xrev is formed by a combination of an X mark 15Xrev provided on a template and an X mark 25Xrev provided on a wafer. Periodic intervals in the X direction of the X marks 15Xrev and 25Xrev are exchanged with the periodic intervals of the X marks 15X and 25X. That is, the periodic interval of the X mark 15Xrev is equal to the periodic interval of the X mark 25X, and the periodic interval of the X mark 25Xrev is equal to the periodic interval of the X mark 15X.

Since the moiré marks 35X and 35Xrev are configured as above, for example, when the X mark 15X is shifted in the positive X direction with respect to the X mark 25X, a phase of the moiré mark 35Xrev is shifted in the negative X direction assuming that a phase of the moiré mark 35X is shifted in the positive X direction. As a result, a double magnification ratio can be obtained by combining the two moiré marks 35X and 35Xrev. The moiré marks 35X and 35Xrev configured as above are referred to as the differential moiré marks.

The moiré mark 35Yrev is formed by a combination of a Y mark 15Yrev provided on the template and a Y mark 25Yrev provided on the wafer. The Y mark 25Yrev is a mirror image of the Y mark 25Y. In other words, an oblique direction of the Y mark 25Yrev in the Y direction is opposite to the oblique direction of the Y mark 25Y. That is, if it is assumed that the oblique direction of the Y mark 25Y is the positive Y direction, the oblique direction of the Y mark 25Yrev is the negative Y direction.

Since the moiré marks 35Y and 35Yrev are configured as above, for example, when the Y mark 15Y is shifted in the positive Y direction with respect to the Y mark 25Y, a phase of the moiré mark 35Yrev is shifted in the negative Y direction assuming that a phase of the moiré mark 35Y is shifted in the positive Y direction. As a result, a double magnification ratio can be obtained by combining the two moiré marks 35Y and 35Yrev.

Even in the moiré marks 35X, 35Xrev, 35Y, and 35Yrev, the occupied area can be made substantially equal to the block area of the alignment mark.

On the other hand, as illustrated in FIG. 15B, the moiré marks 35X' and 35Xrev' and the moiré marks 35Y' and 35Yrev' of Comparative Example 2 are arranged in the state of being rotated by 90° from each other.

Periodic intervals in the X direction of X marks 15Xrev' and 25Xrev' forming the moiré mark 35Xrev' are exchanged with periodic intervals of X marks 15X' and 25X'.

The moiré mark 35Yrev' is obtained by rotating the moiré mark 35Xrev' by 90°, and periodic intervals in the Y direction of Y marks 15Yrev' and 25Yrev' forming the moiré mark 35Yrev' are exchanged with periodic intervals of Y marks 15Y' and 25Y'.

It is assumed that lower limits of sizes Lx and Ly of the moiré marks 35X' and 35Xrev' and lower limits of sizes Lx and Ly of the moiré marks 35Y' and 35Yrev' are set to be the same as the respective lower limits in Comparative Example 1.

Size Lx of Moire Marks 35X' and 35Xrev'>72 μm

Ly=20 μm

Size Lx of moiré marks 35Y' and 35Yrev'=20 μm

Ly>72 μm

In this case, the block area of the alignment mark is 6912 μm² (=(72+20×2)×72) although the area occupied by the moiré marks 35X', 35Xrev', 35Y', and 35Yrev' is 5760 μm² (=72×20×2×2).

On the other hand, no wasteful area is generated within a block of the alignment mark in the moiré marks 35X, 35Xrev, 35Y, and 35Yrev as illustrated in FIG. 15A. As described above, the same effect as in the above embodiment is achieved even in the differential moiré marks 35X, 35Xrev, 35Y, and 35Yrev.

Although the examples of FIGS. 15A and 15B illustrate the moiré marks 35X, 35Xrev, 35Y, and 35Yrev, other moiré marks 36Y and 37Y and differential moiré marks 36Yrev and 37Yrev thereof, or the like may be used instead of the moiré marks 35Y and 35Yrev.

(Fifth Modification)

Figure 16A:
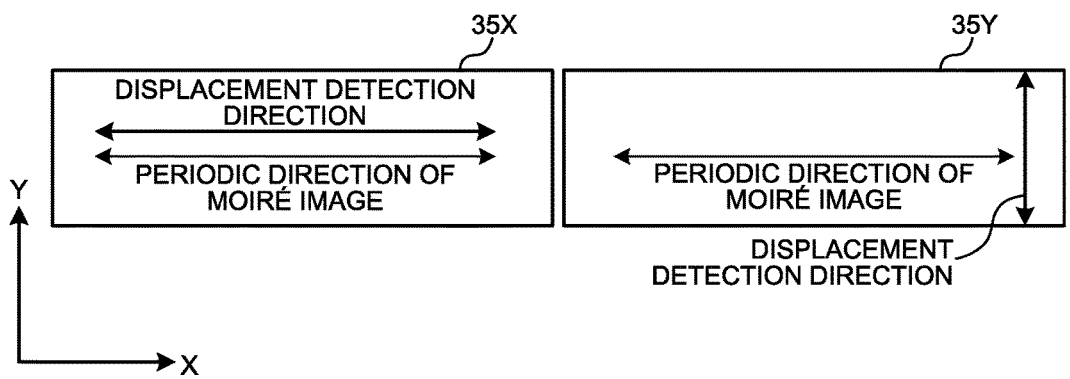
FIG. 16A is a schematic view illustrating an example of arrangement of moiré marks according to a fifth modification of the embodiment.
Figure 16B:
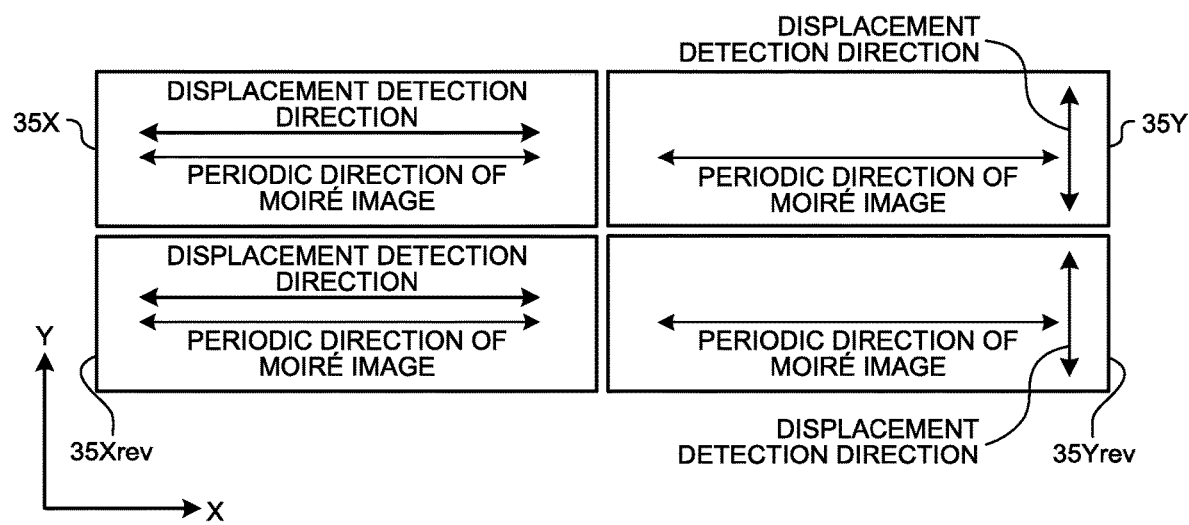
FIG. 16B is a schematic view illustrating an example of arrangement of moiré marks according to the fifth modification of the embodiment.

Next, arrangement of alignment marks of a fifth modification of the embodiment will be described with reference to FIGS. 16A and 16B. FIGS. 16A and 16B are schematic views illustrating examples of arrangement of the moiré marks 35X, 35Xrev, 35Y, and 35Yrev according to the fifth modification of the embodiment. The moiré marks 35X, 35Xrev, 35Y, and 35Yrev according to the fifth modification of the embodiment are arranged in parallel to each other, which is different from the above embodiment and fourth modification.

FIG. 16A illustrates an example in which the moiré marks 35X and 35Y are arranged in parallel. FIG. 16B illustrates an example in which the moiré marks 35X and 35Y and the moiré marks 35Xrev and 35Yrev are arranged in parallel.

As above, it is possible to arrange the moiré marks 35X, 35Xrev, 35Y, and 35Yrev to be extended in one direction in the fifth modification of the embodiment. Thus, the moiré marks 35X, 35Xrev, 35Y, and 35Yrev can be arranged, for example, even when a width of a kerf area on a wafer is narrow.

Although the examples of FIGS. 16A and 16B illustrate the moiré marks 35X, 35Xrev, 35Y, and 35Yrev, other moiré marks 36Y and 37Y and differential moiré marks 36Yrev and 37Yrev thereof, or the like may be used instead of the moiré marks 35Y and 35Yrev.

(Other Modifications)

Although the description has been given in the above embodiment and modifications regarding, for example, the alignment mark in which at least one of the Y marks of the template and the wafer is made oblique and both the X mark and the X mark have the displacement appearing in the X direction, the embodiment is not limited thereto. As the X mark, marks obtained by rotating the Y marks 15Y and 25Y of the embodiment by 90°, marks obtained by rotating the Y marks 16Y and 26Y of the first modification of the embodiment by 90°, or marks obtained by rotating the Y marks 17Y and 27Y of the second modification of the embodiment by 90° may be used. In this case, marks obtained by rotating the X marks 15X and 25X of the embodiment by 90° can be used as the Y mark. Accordingly, it is possible to form the alignment mark with displacement appearing in the Y direction for both the X mark and the Y mark.

For example, the X mark and the Y mark of the template are formed in a stripe shape and the X mark and the Y mark of the wafer are formed in a checkered grating shape in the above embodiment and modifications, but the embodiment is not limited thereto. For example, the X mark and the Y mark of the template may be formed in a checkered grating shape and the X mark and the Y mark of the wafer may be formed in a stripe shape. Alternatively, both the X mark and the Y mark of the template and the wafer may be in a checkered grating pattern. However, it is preferable that a light source side of a microscope have a stripe shape, and a side opposite to the light source have a checkered grating shape. This is because noise, such as scattered light, is more likely to occur in one of the template and the wafer positioned on the light source side. As the alignment mark is formed in a simpler pattern, such noise can be reduced.

Although the moiré marks 35X, 35Y and the like are applied to the template and the wafer during the imprint processing in the above embodiment and modifications, the embodiment is not limited thereto. The moiré marks of the embodiment and the modifications may be applied to proximity exposure processing, near-field optical lithography processing, or the like, for example. As an example, a proximity exposure apparatus 2 in the case of applying the moiré marks of the embodiment and the modifications will be described with reference to FIG. 17.

Figure 17:
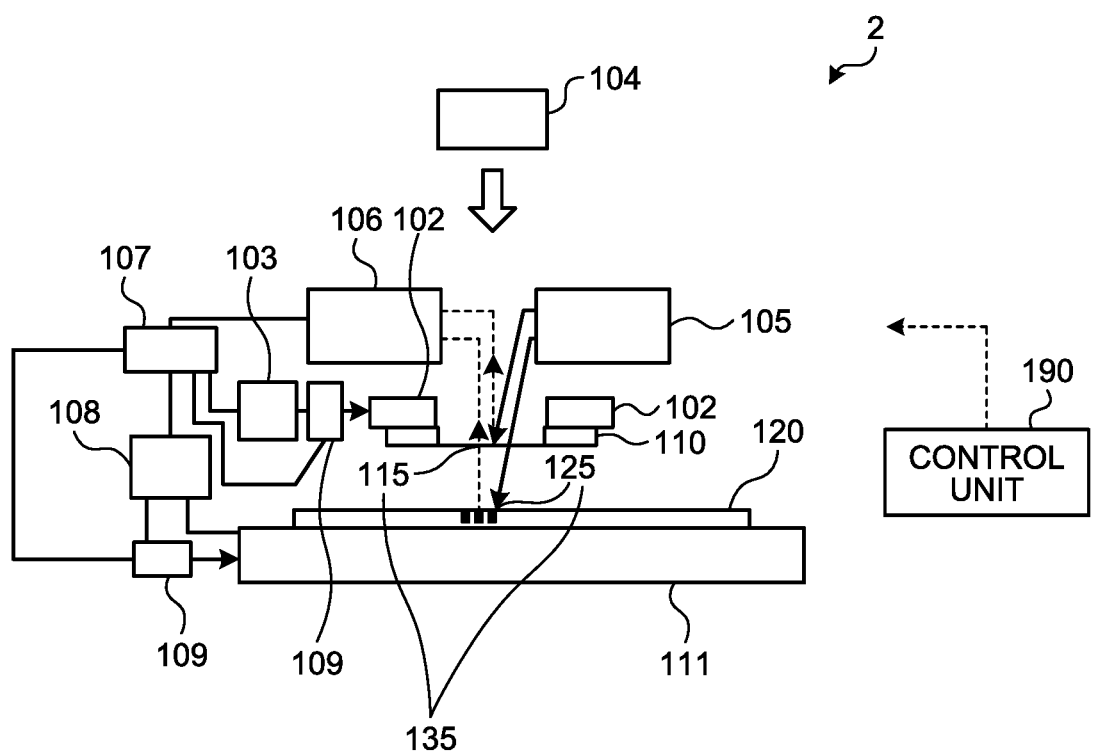
FIG. 17 is a diagram illustrating a configuration example of a proximity exposure apparatus according to another modification of the embodiment.

As illustrated in FIG. 17, the proximity exposure apparatus 2 includes a reticle stage 102, a reticle stage drive control device 103, an exposure light generation device 104, a position detection illumination optical system 105, a position detection light receiving optical system 106, a signal calculation processing system 107, a wafer stage drive control device 108, a detection light measuring device 109, and a wafer stage 111. The respective units are controlled by a control unit 190. In the proximity exposure apparatus 2, a reticle (or a mask, which will be described as the reticle hereinafter) 110 to transfer a fine pattern onto a resist on a wafer 120 is installed.

The reticle 110 is installed at a predetermined position by the reticle stage 102. The wafer 120 is held by the wafer stage 111. The reticle 110 and the wafer 120 are held such that a gap and the degree of parallelism therebetween become desired values.

The reticle 110 is provided with the fine pattern and an alignment mark 115. The wafer 120 is provided with an alignment mark 125. Any configuration of the above embodiment and modifications is applied to the alignment marks 115 and 125.

The alignment mark 115 of the reticle 110 and the alignment mark 125 of the wafer 120 are illuminated with detection light generated by the position detection illumination optical system 105. When the alignment marks 115 and 125 of the reticle 110 and the wafer 120 are adjusted to positions overlapping each other vertically, a moiré mark 135 is formed. Then, the detection light from a moiré image of the moiré mark 135 is guided to the position detection light receiving optical system 106.

The detection light guided to the position detection light receiving optical system 106 is sent to the signal calculation processing system 107, and positions of the alignment marks 115 and 125 are calculated. The signal calculation processing system 107 performs arithmetic processing configured to determine proper positions of the alignment marks 115 and 125, and has a function of comparing and processing relative positional deviation between the detected positions of the alignment marks 115 and 125, a phase, a signal intensity, and an S/N ratio of the moiré image.

In addition, the signal calculation processing system 107 transmits signals to the reticle stage drive control device 103 and the wafer stage drive control device 108, and issues commands for driving control of the respective stages 102 and 111. In addition, the signal calculation processing system 107 shares stage position coordinate information detected by the detection light measuring device 109. As a result, the positions of the reticle 110 and the wafer 120 are aligned, and the fine pattern on the reticle 110 is exposed to the wafer 120 with a predetermined positional accuracy. The wafer 120 is irradiated with exposure light from the exposure light generation device 104 through the reticle 110.

EXAMPLES

Next, a case where the alignment mark according to the embodiment is applied to examples will be described with reference to FIGS. 18A and 18B to 25A and 25B. There are restrictions on the application of the alignment mark to the examples mainly in terms of pattern formation and from the viewpoint of suppressing scattered light.

The restriction in terms of the pattern formation will be described in detail. When forming a pattern such as an alignment mark on a template, for example, a master template is used to perform imprint processing on the template. When forming a pattern such as an alignment mark on a wafer, for example, a reticle is used to perform exposure processing on the wafer. When forming a pattern on the master template and the reticle, for example, high-definition and low-throughput drawing using electron beam is performed. At this time, a drawing pattern is formed in a rectangle in some cases in order to increase the throughput of the drawing as much as possible. Thus, the alignment marks of the template and the wafer are also formed of a combination of fine rectangles.

The restriction of the scattered light will be described in detail. Since a dark-field optical system is used for observation of an alignment mark, scattered light (noise) larger than scattered light (detection light) from the moiré image may occur at an interruption portion (an end portion of the alignment mark) of a periodic structure. Such noise may occur even when the alignment mark or the like is adjacent to another pattern. Therefore, it is preferable to arrange a blank band having a width of a degree of optical resolution as a noise cancel pattern (NCP) so as to surround the alignment mark.

Example 1

Figure 18A:
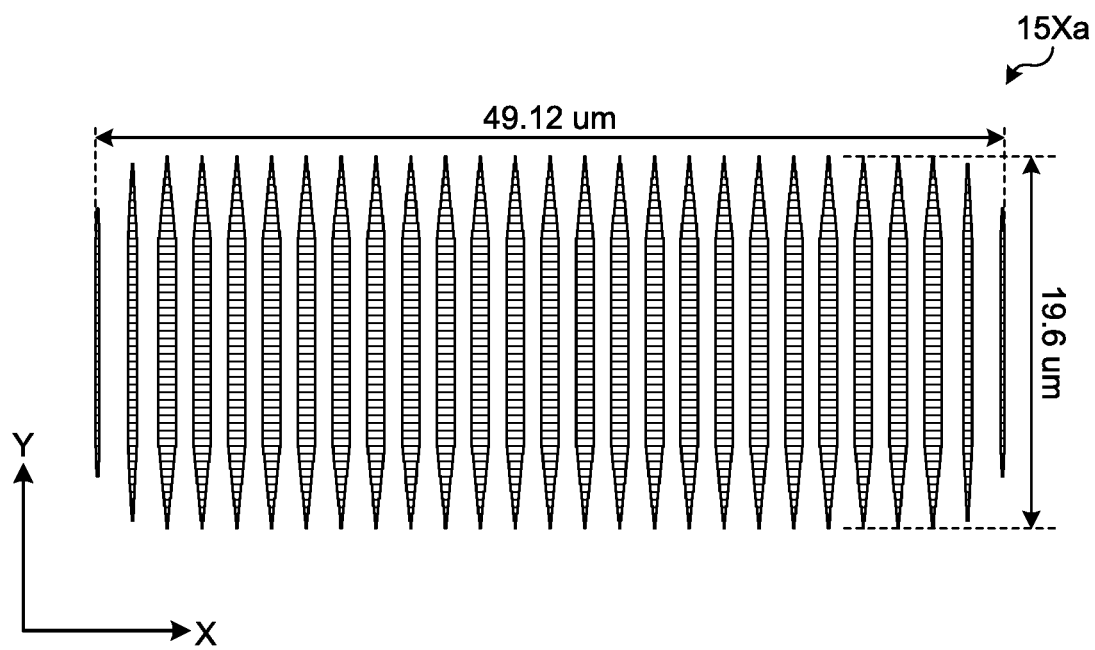
FIG. 18A is a schematic view illustrating an example of a configuration of X marks of a template and a wafer according to Example 1.
Figure 18B:
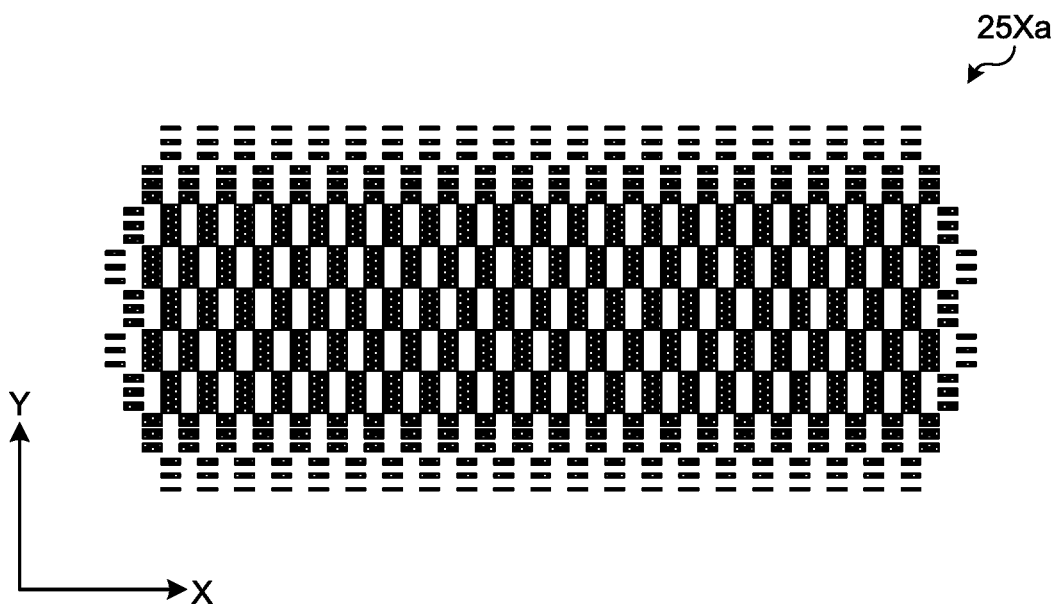
FIG. 18B is a schematic view illustrating an example of a configuration of X marks of the template and the wafer according to Example 1.

FIGS. 18A and 18B illustrate examples of the X marks 15X and 25X according to the embodiment applied to an example. FIGS. 18A and 18B are schematic views illustrating examples of configurations of X marks 15Xa and 25Xa of a template and a wafer according to Example 1.

As illustrated in FIGS. 18A and 18B, NCPs are arranged in the vicinity of outer edges of the X marks 15Xa and 25Xa, and the scattering area is modulated based on a window function to suppress scattered light in a dark field caused by the interruption of the periodic structure. Specifically, in the X mark 15Xa, a pattern width at an outer edge portion in the X direction is narrowed, and further, a pattern width is gradually decreased to form a wedge shape at an outer edge portion in the Y direction, thereby reducing the equivalent scattering area. In the X mark 25Xa, a rectangle forming the checkered grating is divided into three in the Y direction, and a width of each rectangle in the Y direction at outer edge portions in the X direction and the Y direction is narrowed, thereby reducing the equivalent scattering area. As a result, directions of dimensional changes based on the window function are orthogonal between the template side and the wafer side so that it is possible to further suppress generation of noise caused by an abrupt interruption of periodicity.

In addition, since the influence of light scattering is larger on the template side than on the wafer side, the X mark 15Xa on the template side is made slightly larger than the X mark 25Xa on the wafer side. For example, the X mark 15Xa was set to have a length in the X direction of 49.12 μm and a length in the Y direction of 19.6 μm. Since the stripe-shaped X mark 15Xa is formed on the template side, it is possible to form the X mark 15Xa in a shape smoother than a checkered grating shape on the template side where the influence of scattered light is larger than the influence on the wafer side, and it is possible to suppress unexpected noise.

In addition, a periodic interval P(X)x,t in the X direction of the X mark 15Xa was set to 1880 nm, for example. In addition, a periodic interval P(X)x,w in the X direction of the X mark 25Xa was set to 2000 nm, for example, and a periodic interval P(X)y,w in the Y direction thereof was set to 4500 nm, for example.

Figure 19A:
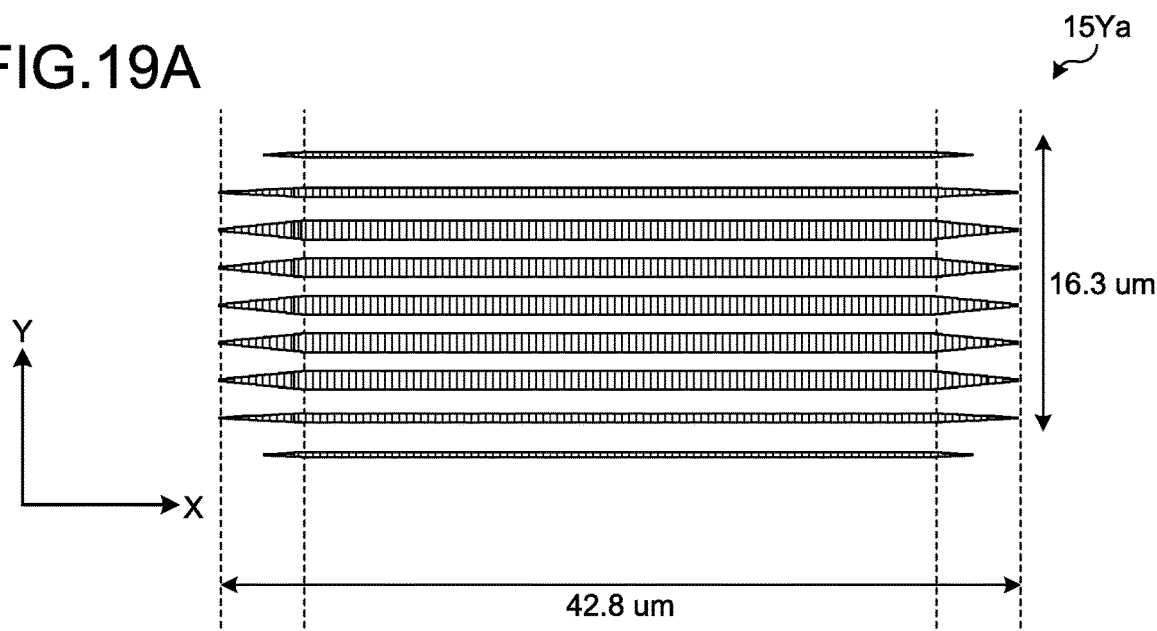
FIG. 19A is a schematic view illustrating an example of a configuration of Y marks of the template and the wafer according to Example 1.
Figure 19B:
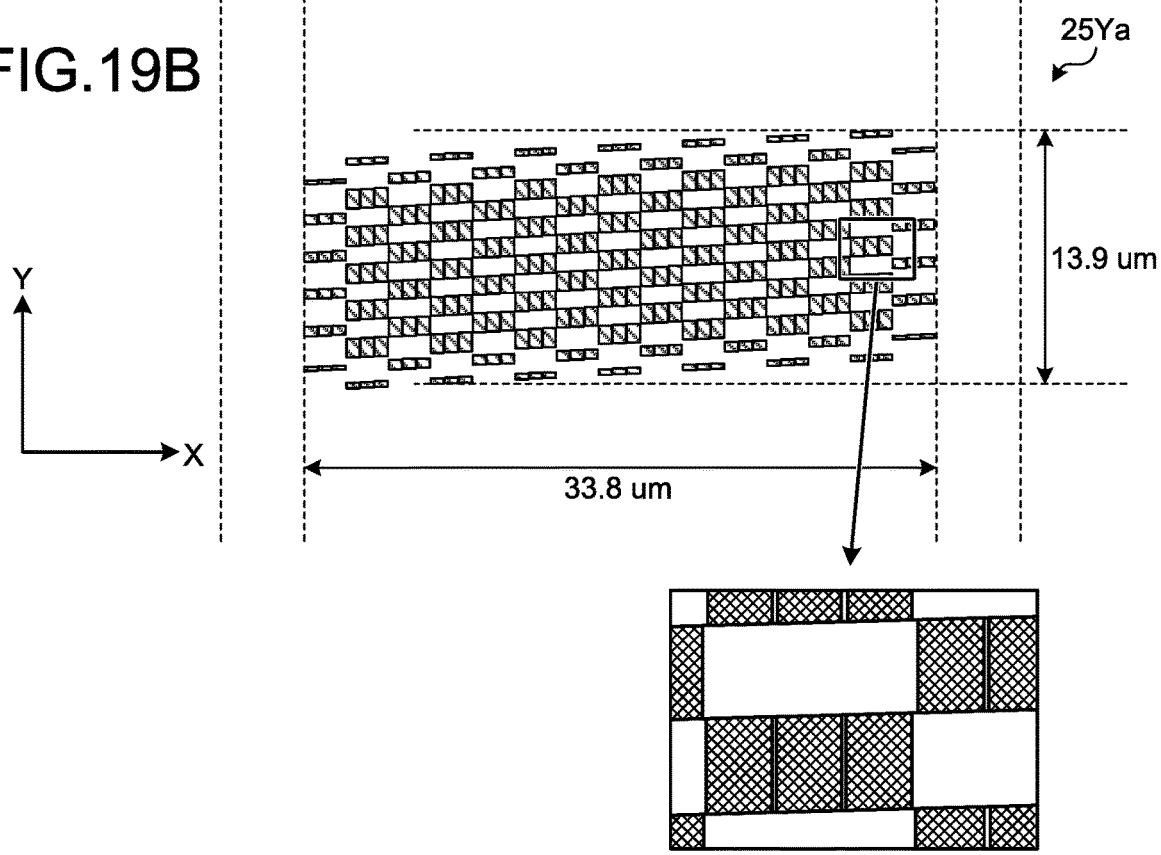
FIG. 19B is a schematic view illustrating an example of a configuration of Y marks of the template and the wafer according to Example 1.

FIGS. 19A and 19B illustrate examples of the Y marks 15Y and 25Y according to the embodiment applied to an example. FIGS. 19A and 19B are schematic views illustrating examples of configurations of Y marks 15Ya and 25Ya of a template and a wafer according to Example 1.

As illustrated in FIGS. 19A and 19B, NCPs are arranged in the vicinity of outer edges of the Y marks 15Ya and 25Ya, and the scattering area is modulated based on a window function to suppress scattered light in a dark field caused by the interruption of the periodic structure. Specifically, in the Y mark 15Ya, a pattern width is gradually decreased to form a wedge shape at an outer edge portion in the X direction, and further, a line width is narrowed at an outer edge portion in the Y direction, thereby reducing the equivalent scattering area. In the Y mark 25Ya, a rectangle forming the checkered grating is divided in the Y direction, and a width of each rectangle in the Y direction at outer edge portions in the X direction and the Y direction is narrowed, thereby reducing the equivalent scattering area. As a result, directions of dimensional changes based on the window function are orthogonal between the template side and the wafer side so that it is possible to further suppress generation of noise caused by an abrupt interruption of periodicity.

In addition, since the influence of light scattering is larger on the template side than on the wafer side, the Y mark 15Ya on the template side is made slightly larger than the Y mark 25Ya on the wafer side. For example, the Y mark 15Ya was set to have a length in the X direction of 42.8 μm and a length in the Y direction of 16.3 μm. In addition, for example, the Y mark 25Ya was set to have a length in the X direction of 33.8 μm and a length in the Y direction of 13.9 μm.

In addition, a periodic interval P(Y)y,t in the Y direction in the Y mark 15Ya was set to 2000 nm, for example. In addition, for example, a periodic interval P(Y)x,w in the X direction of the Y mark 25Ya was set to 4500 nm, and a periodic interval P(Y)y,w in the Y direction thereof was set to 2000 nm. In addition, the number of periods of the periodic structure was set to 7.5 in the X direction and 6.5 in the Y direction using the Y mark 25Ya, for example, as a reference.

When the Y mark 25Ya is made oblique, a rectangle divided into three in the X direction was shifted by 40 nm in the Y direction each time an X coordinate is changed by 750 nm.

Figure 20A:
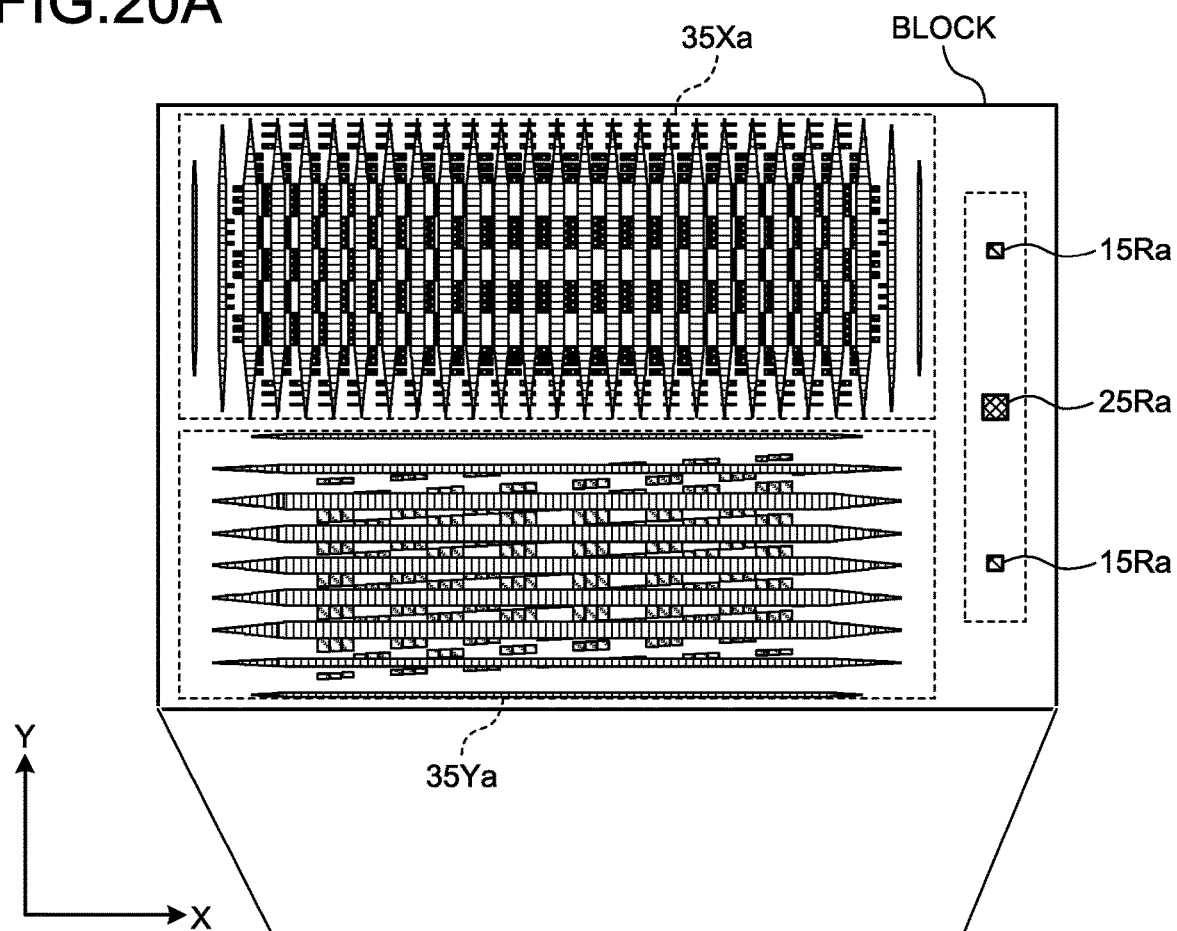
FIG. 20A is a schematic view illustrating an example of a configuration of a moiré mark according to Example 1.
Figure 20B:
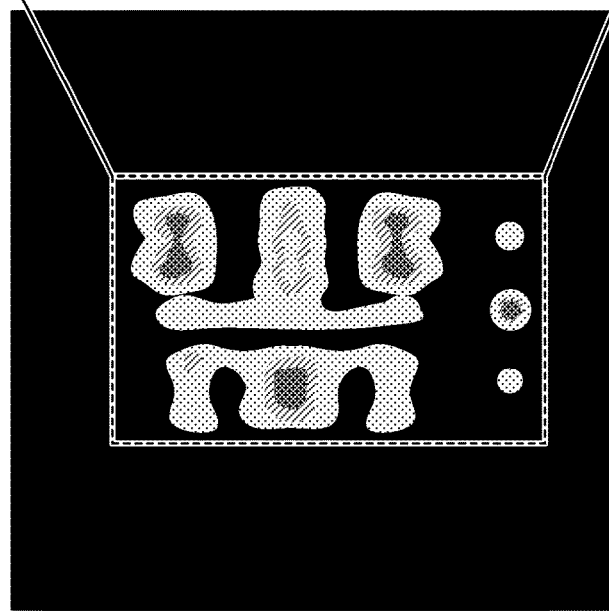
FIG. 20B is a schematic view illustrating an example of the configuration of the moiré mark according to Example 1.

FIGS. 20A and 20B illustrate a moiré mark 35Xa formed of the X marks 15Xa and 25Ra and a moiré mark 35Ya formed of the Y marks 15Ya and 25Ya. FIGS. 20A and 20B are schematic views illustrating examples of configurations of moiré marks 35Xa and 35Ya according to Example 1.

As illustrated in FIG. 20A, the moiré marks 35Xa and 35Ya are arranged in concurrent with each other, and rough inspection marks 15Ra and 25Ra are arranged at end portions of the moiré marks 35Xa and 35Ya in the X direction. The rough inspection marks 15Ra and 25Ra are obtained by applying the rough inspection marks 15R and 25R (see FIG. 14) of the third modification of the above embodiment to the example. The rough inspection mark 15Ra is provided on the template, and the rough inspection mark 25Ra is provided on the wafer.

In the example of FIG. 20A, the block area of the moiré marks 35Xa and 35Ya and the rough inspection marks 15Ra and 25Ra is, for example, 60 μm×40 μm. The moiré marks 35Xa and 35Ya are substantially equal in size and orientations thereof in the longitudinal direction can be made uniform, and thus, the moiré marks 35Xa and 35Ya can fit within a compact block.

In the example, a periodic interval of a moiré image generated by the moiré mark 35Xa is, for example, 15.7 μm, and at this time, a magnification ratio of the moiré mark 35Xa is 16.2 times. In addition, a magnification ratio of the moiré mark 35Ya is 18.75 times.

FIG. 20B illustrates a simulation result of the moiré image generated by the moiré marks 35Xa and 35Ya. It is understood that interference fringes of the moiré image extend in the Y direction and have periodicity in the X direction. In addition, the rough inspection marks 15Ra and 25Ra show each displacement amount of equal times with respect to each displacement amount of positions of the template and the wafer, and thus, the moiré image is not substantially displaced. That is, the above rough inspection marks 15Ra and 25Ra function as pseudo moiré images.

FIG. 21 illustrates another example of the moiré mark 35Xa formed of the X marks 15Xa and 25Ra and the moiré mark 35Ya formed of the Y marks 15Ya and 25Ya. FIG. 21 is a schematic view illustrating another example of the configuration of the moiré marks 35Xa and 35Ya according to Example 1.

As illustrated in FIG. 21, the moiré mark 35Xa, the rough inspection marks 15Ra and 25Ra, and the moiré mark 35Ya are arranged in parallel in this order. In the example of FIG. 21, the block area of the moiré marks 35Xa and 35Ya and the rough inspection marks 15Ra and 25Ra is, for example, 120 μm×30 μm. It is also possible to obtain such elongated block arrangement by changing the arrangement of the moiré marks 35Xa and 35Ya and the rough inspection marks 15Ra and 25Ra.

Example 2

Figure 22A:
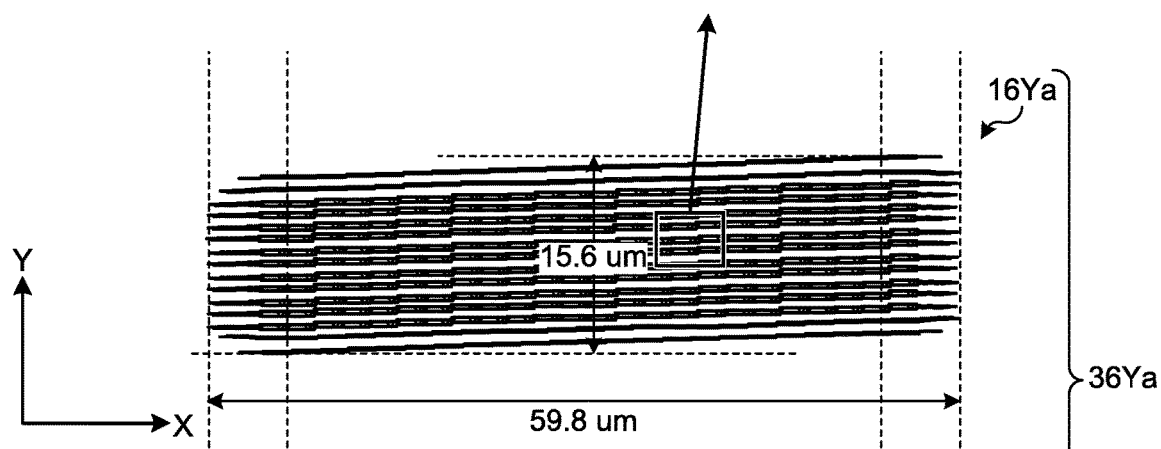
FIG. 22A is a schematic view illustrating an example of a configuration of Y marks of a template and a wafer according to Example 2.
Figure 22B:
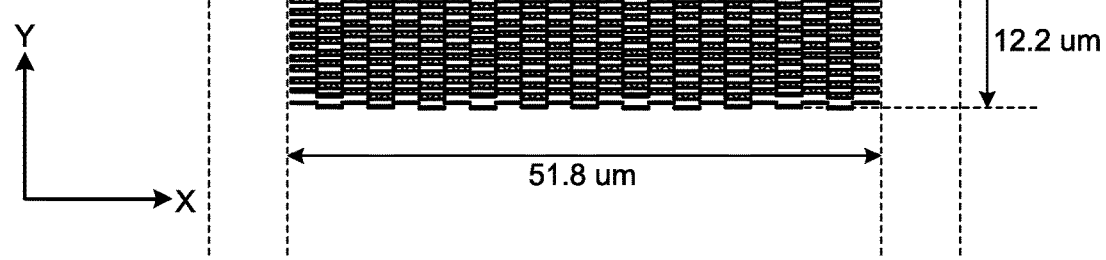
FIG. 22B is a schematic view illustrating an example of a configuration of Y marks of the template and the wafer according to Example 2.

FIGS. 22A and 22B illustrate examples of the Y marks 16Y and 26Y according to the embodiment applied to an example. FIGS. 22A and 22B are schematic views illustrating examples of configurations of Y marks 16Ya and 26Ya of a template and a wafer according to Example 2.

The Y marks 16Ya and 26Ya of Example 2 are examples in which the Y mark 16Ya on the template side is made oblique similarly to the Y marks 16Y and 26Y of the first modification of the embodiment. However, an oblique direction of the Y mark 16Ya is opposite to the oblique direction of the Y mark 16Y in the Y direction.

A method of applying an NCP for the Y marks 16Ya and 26Ya is the same as the method for the Y marks 15Ya and 25Ya of Example 1.

In addition, for example, the Y mark 16Ya was set to have a length in the X direction of 59.8 μm and a length in the Y direction of 15.6 μm. In addition, for example, the Y mark 26Ya was set to have a length in the X direction of 51.8 μm and a length in the Y direction of 12.2 μm.

In addition, a periodic interval $P(Y)y,t$ in the Y direction of the Y mark 16Ya was set to, for example, 1000 nm. In addition, for example, a periodic interval $P(Y)x,w$ in the X direction of the Y mark 26Ya was set to 4500 nm, and a periodic interval $P(Y)y,w$ in the Y direction thereof was set to 1000 nm. In addition, the number of periods of the periodic structure was set to 11.5 in the X direction and 12.5 in the Y direction using the Y mark 25Ya, for example, as a reference.

When the Y mark 16Ya is made oblique, a rectangle divided in the X direction was shifted by 60 nm in the Y direction each time an X coordinate is changed by 2250 nm. A division width of the rectangle in the X direction is half of a periodic interval of the Y mark 26Ya in the X direction.

In the example, a magnification ratio of the moiré mark 36Ya generated by a combination of the Y marks 16Ya and 26Ya is 37.5 times.

The above moiré mark 36Ya can be also arranged as illustrated in FIG. 20A, 20B, 21, or the like in combination with the moiré mark 35Xa, the rough inspection marks 15Ra and 25Ra, and the like of Example 1.

Example 3

Next, X marks 15Xb and 25Xb and Y marks 15Yb and 25Yb of Example 3 will be described with reference to FIGS. 23A and 23B to 25A and 25B. Interference of a moiré image appears not in a stripe shape but in a dot shape in the X marks 15Xb and 25Xb and the Y marks 15Yb and 25Yb of Example 3, which is different from the above examples.

The moiré image may be a dot-shaped image as long as a displacement amount can be accurately measured. That is, a size in a direction orthogonal to a displacement direction of the moiré image can be reduced to a larger size between a size equal to a resolution of an optical system and a size with which a periodic structure in the X direction can generate a sufficient light amount of high-order diffracted light.

Here, the resolution of the optical system is about 0.5 $\lambda/NA$ to $\lambda/NA$. For example, when it is assumed that an observation wavelength $\lambda$ is 700 nm and the number NA of observation apertures is 0.07, the resolution of the optical system is about 5 μm to 10 μm. Therefore, it is possible to compress the size of the alignment mark in the Y direction to about 10 μm with such an optical system.

Figure 23A:
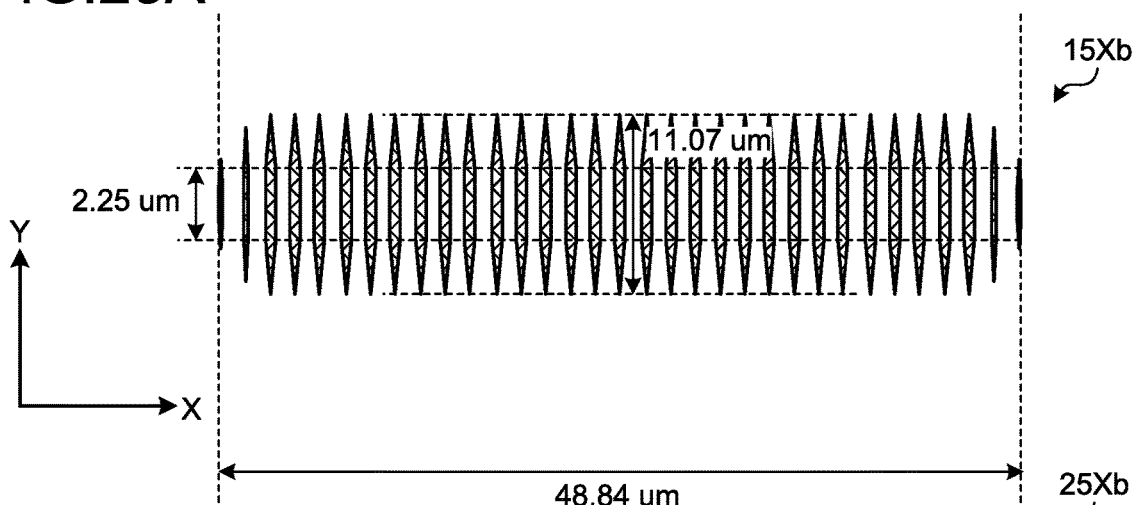
FIG. 23A is a schematic view illustrating an example of a configuration of X marks of a template and a wafer according to Example 3.
Figure 23B:
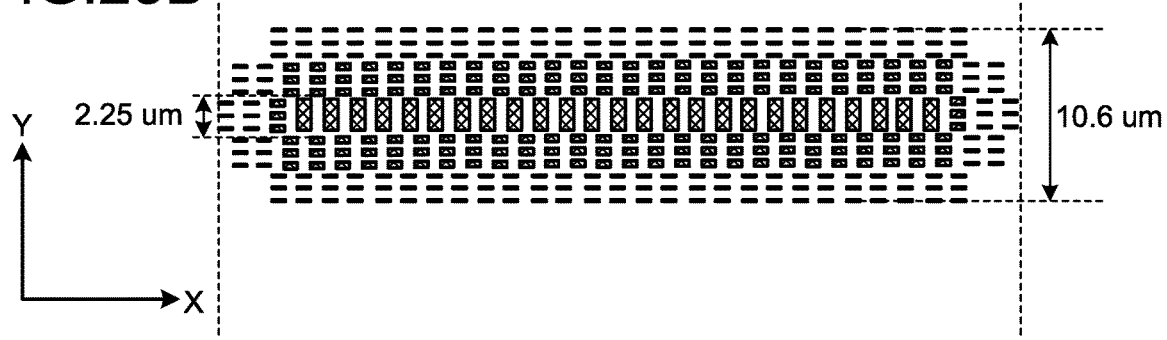
FIG. 23B is a schematic view illustrating an example of a configuration of X marks of the template and the wafer according to Example 3.

FIGS. 23A and 23B illustrate another application example of the X marks 15X and 25X according to the embodiment applied to an example. FIGS. 23A and 23B are schematic views illustrating examples of configurations of the X marks 15Xb and 25Xb of the template and the wafer according to Example 3.

A method of applying an NCP for the X marks 15Xb and 25Xb is the same as the method for the X marks 15Xa and 25Xa of Example 1.

In addition, for example, the X mark 15Xb was set to have a length in the X direction of 48.84 μm and a length in the Y direction of 11.07 μm. In addition, a length of the X mark 15Xb excluding the NCP (a portion forming a moiré image) in the Y direction was set to, for example, 2.25 μm. In addition, for example, the X mark 25Xb was set to have a length in the X direction of 48.84 μm and a length in the Y direction of 10.6 μm. In addition, for example, a length of the X mark 25Xb excluding the NCP (a portion forming a moiré image) in the Y direction was set to 2.25 μm.

In addition, a periodic interval $P(X)x,t$ in the X direction of the X mark 15Xa was set to 1520 nm, for example. In addition, for example, a periodic interval $P(X)x,w$ in the X direction of the X mark 25Xa was set to 1600 nm, and a periodic interval $P(X)y,w$ in the Y direction thereof was set to 4500 nm.

FIGS. 24A and 24B illustrate another application example of the Y marks 15Y and 25Y according to the embodiment applied to an example. FIGS. 24A and 24B are schematic views illustrating examples of configurations of the Y marks 15Yb and 25Yb of the template and the wafer according to Example 3.

The Y marks 15Yb and 25Yb of Example 3 are examples in which Y mark 25Yb on the wafer side is made oblique similarly to the Y marks 15Y and 25Y of the embodiment. However, an oblique direction of the Y mark 25Yb is opposite to the oblique direction of the Y mark 25Y in the Y direction.

A method of applying an NCP for the Y marks 15Yb and 25Yb is the same as the method for the Y marks 15Ya and 25Ya of Example 1.

In addition, for example, the Y mark 15Yb was set to have a length in the X direction of 56.24 μm and a length in the Y direction of 11.36 μm. In addition, for example, the Y mark 25Yb was set to have a length in the X direction of 56.24 μm and a length in the Y direction of 10.48 μm.

In addition, a periodic interval $P(Y)y,t$ in the Y direction of the Y mark 15Yb was set to, for example, 1600 nm. In addition, for example, a periodic interval $P(Y)x,w$ in the X direction of the Y mark 25Yb was set to 4500 nm, and a periodic interval $P(Y)y,w$ in the Y direction thereof was set to 1600 nm. In addition, the number of periods of the periodic structure was set to 6 in the X direction and 12.5 in the Y direction using the Y mark 25Ya, for example, as a reference.

When the Y mark 25Yb is made oblique, a rectangle divided into three in the X direction was shifted by 25 nm in the Y direction each time an X coordinate is changed by 750 nm.

Figure 25A:
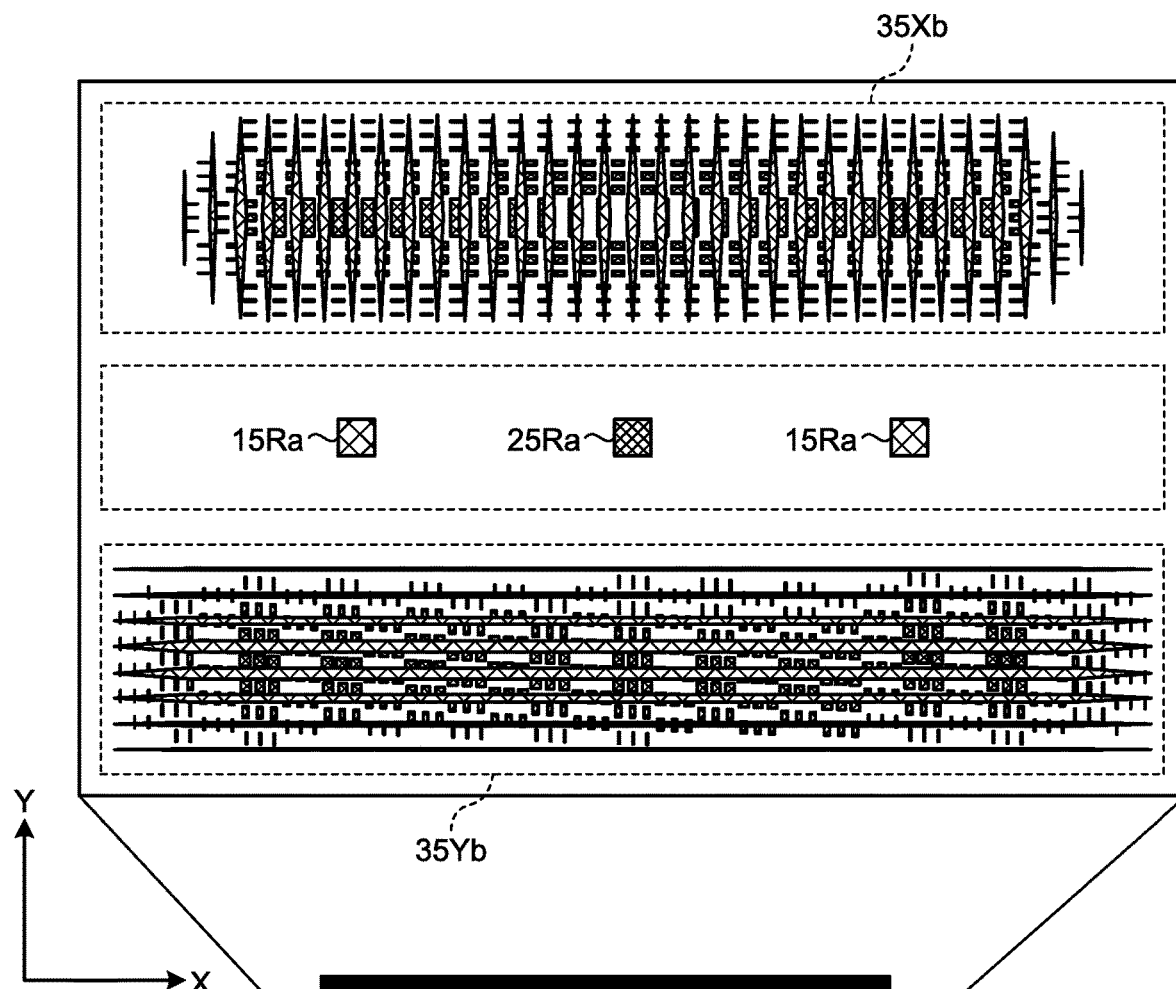
FIG. 25A is a schematic view illustrating an example of a configuration of a moiré mark according to Example 3.
Figure 25B:
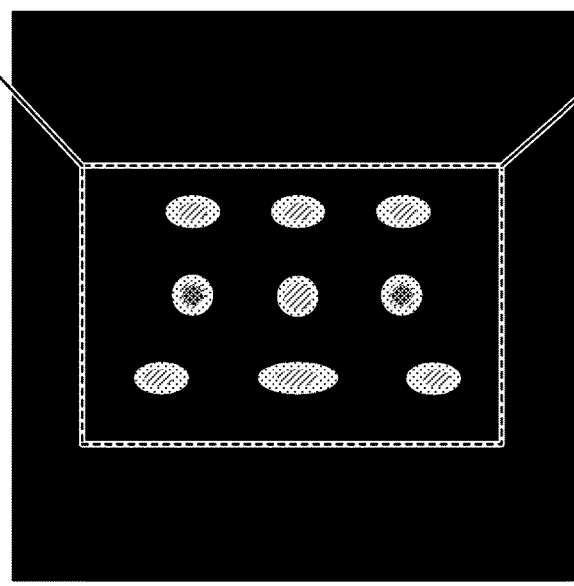
FIG. 25B is a schematic view illustrating an example of the configuration of the moiré mark according to Example 3.

FIGS. 25A and 25B illustrate a moiré mark 35Xb formed of the X marks 15Xb and 25Xb and a moiré mark 35Yb formed of the Y marks 15Yb and 25Yb. FIGS. 25A and 25B are schematic views illustrating examples of configurations of the moiré marks 35Xb and 35Yb according to Example 3.

As illustrated in FIG. 25A, the moiré mark 35Xb, the rough inspection marks 15Ra and 25Ra, and the moiré mark 35Yb are arranged in concurrent in order.

In the example of FIG. 25A, the block area of the moiré marks 35Xb and 35Yb and the rough inspection marks 15Ra and 25Ra is 60 µm×40 µm. The moiré marks 35Xb and 35Yb are substantially equal in size and orientations thereof in the longitudinal direction can be made uniform, and thus, the moiré marks 35Xb and 35Yb can fit within a compact block.

In the example, a periodic interval of a moiré image generated by the moiré mark 35Xb is, for example, 15.21 µm, and at this time, a magnification ratio of the moiré mark 35Xb is 19.25 times. In addition, a magnification ratio of the moiré mark 35Yb is 30.0 times.

FIG. 25B illustrates a simulation result of the moiré image generated by the moiré marks 35Xb and 35Yb. It is understood that interference of the moiré image extends in a dot shape and has periodicity in the X direction.

Incidentally, these moiré marks 35Xb and 35Yb and the rough inspection marks 15Ra and 25Ra can also be arranged in parallel as illustrated in FIG. 21 and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An alignment mark comprising a combination of a first pattern and a second pattern, one of the patterns being provided on a surface of an original to transfer a pattern onto a resist on a substrate, the surface on which the pattern has been formed, the other pattern being provided on a surface of the substrate to which the pattern is transferred, wherein
when XY coordinates common to the surface of the original and the surface of the substrate are set and the original and the substrate face each other in parallel such that directions of the first pattern and the second pattern coincide with each other with respect to the XY coordinates,
the first pattern has a periodic structure in a first direction on the surface of the original or the surface of the substrate and extends in a second direction,
the second pattern has a periodic structure in a third direction on the surface of the original or the surface of the substrate and extends in a fourth direction,
the first direction and the third direction are parallel to each other,
a period in the first direction of the periodic structure of the first pattern is equal to a period in the third direction of the periodic structure of the second pattern,
at least one of the first pattern and the second pattern has a periodic structure in a fifth direction orthogonal to the first direction and the third direction on the surface of the original or the surface of the substrate, and
at least one of the second direction and the fourth direction is oblique with respect to the fifth direction.

2. The alignment mark according to claim 1, wherein
the second direction and the fourth direction are oblique with respect to the fifth direction,
an angle formed by the first direction and the second direction is an acute angle, and
an angle formed by the third direction and the fourth direction is an obtuse angle.

3. The alignment mark according to claim 1, wherein
the first pattern and the second pattern are formed by combining rectangles,
a first side of the rectangle is parallel to the first direction and the third direction,
a second side of the rectangle is orthogonal to the first direction and the third direction, and
the first pattern extends in the second direction as the rectangles adjacent to each other in the fifth direction are arranged to be shifted from each other by a predetermined distance in the first direction.

4. The alignment mark according to claim 3, wherein
the second pattern extends in the fourth direction as the rectangles adjacent to each other in the fifth direction are arranged to be shifted from each other by a predetermined distance in the third direction.

5. The alignment mark according to claim 1, further comprising
a combination of a third pattern and a fourth pattern, one of the patterns being provided on the surface of the original, the other pattern being provided on the surface of the substrate,
wherein the third pattern has a periodic structure in the fifth direction and extends in a sixth direction,
the fourth pattern has a periodic structure in the fifth direction and extends in a seventh direction,
the sixth direction and the seventh direction are parallel to each other, and
a period in the fifth direction of the periodic structure of the third pattern is different from a period in the fifth direction of the periodic structure of the fourth pattern.

6. The alignment mark according to claim 5, further comprising
a set of a first portion and a second portion provided on one of the original and the substrate and a third portion provided on the other of the original and the substrate,
wherein, in a state where the original and the substrate are aligned, the first portion, the third portion, and the second portion are arranged on a straight line in order,
an interval between the first portion and the third portion is equal to an interval between the third portion and the second portion, and
the straight line is parallel to the first direction or the fifth direction.

7. The alignment mark according to claim 5, further comprising:
a combination of a fifth pattern provided on the same surface as the first pattern and a sixth pattern provided on the same surface as the second pattern; and a combination of a seventh pattern provided on the same surface as the third pattern and an eighth pattern provided on the same surface as the fourth pattern,
wherein the fifth pattern is a mirror image of the first pattern and the sixth pattern is a mirror image of the second pattern,
the seventh pattern has a periodic structure in the fifth direction and extends in the sixth direction,
the eighth pattern has a periodic structure in the fifth direction and extends in the seventh direction,
a period in the fifth direction of the periodic structure of the seventh pattern is equal to a period in the fifth direction of the periodic structure of the fourth pattern, and
a period in the fifth direction of the periodic structure of the eighth pattern is equal to the period in the fifth direction of the periodic structure of the third pattern.

8. The alignment mark according to claim 7, further comprising
a set of a first portion and a second portion provided on one of the original and the substrate and a third portion provided on the other of the original and the substrate,
wherein, in a state where the original and the substrate are aligned, the first portion, the third portion, and the second portion are arranged on a straight line in order,
an interval between the first portion and the third portion is equal to an interval between the third portion and the second portion, and
the straight line is parallel to the first direction or the fifth direction.

9. An imprinting method comprising:
preparing a substrate onto which a resist is dripped or applied;
performing alignment between an original and the substrate using an alignment mark in a state where the original to transfer a pattern onto the resist is brought into proximity with a top of the substrate or a state where the original is brought into contact with the resist;
imprinting a pattern of the original onto the resist on the substrate;
irradiating the substrate with exposure light through the original; and
releasing the original from the resist on the substrate,
wherein the alignment mark is an alignment mark including a combination of a first pattern and a second pattern, one of the patterns being provided on a surface of the original on which the pattern has been formed, the other pattern being provided on a surface of the substrate to which the pattern is transferred,
when XY coordinates common to the surface of the original and the surface of the substrate are set and the original and the substrate face each other in parallel such that directions of the first pattern and the second pattern coincide with each other with respect to the XY coordinates,
the first pattern has a periodic structure in a first direction on the surface of the original or the surface of the substrate and extends in a second direction,
the second pattern has a periodic structure in a third direction on the surface of the original or the surface of the substrate and extends in a fourth direction,
the first direction and the third direction are parallel to each other,
a period in the first direction of the periodic structure of the first pattern is equal to a period in the third direction of the periodic structure of the second pattern, at least one of the first pattern and the second pattern has a periodic structure in a fifth direction orthogonal to the first direction and the third direction on the surface of the original or the surface of the substrate, and
at least one of the second direction and the fourth direction is oblique with respect to the fifth direction.

10. The imprinting method according to claim 9, wherein
the second direction and the fourth direction are oblique with respect to the fifth direction,
an angle formed by the first direction and the second direction is an acute angle, and
an angle formed by the third direction and the fourth direction is an obtuse angle.

11. The imprinting method according to claim 9, wherein
the first pattern and the second pattern are formed by combining rectangles,
a first side of the rectangle is parallel to the first direction and the third direction,
a second side of the rectangle is orthogonal to the first direction and the third direction, and
the first pattern extends in the second direction as the rectangles adjacent to each other in the fifth direction are arranged to be shifted from each other by a predetermined distance in the first direction, or
the second pattern extends in the fourth direction as the rectangles adjacent to each other in the fifth direction are arranged to be shifted from each other by a predetermined distance in the third direction.

12. The imprinting method according to claim 9, wherein
the alignment mark includes a combination of a third pattern and a fourth pattern is provided, one of the patterns being provided on the surface of the original, the other pattern being provided on the surface of the substrate,
the third pattern has a periodic structure in the fifth direction and extends in a sixth direction,
the fourth pattern has a periodic structure in the fifth direction and extends in a seventh direction,
the sixth direction and the seventh direction are parallel to each other, and
a period in the fifth direction of the periodic structure of the third pattern is different from a period in the fifth direction of the periodic structure of the fourth pattern.

13. The imprinting method according to claim 12, wherein
the alignment mark includes
a combination of a fifth pattern provided on the same surface as the first pattern and a sixth pattern provided on the same surface as the second pattern and
a combination of a seventh pattern provided on the same surface as the third pattern and an eighth pattern provided on the same surface as the fourth pattern are provided,
the fifth pattern is a mirror image of the first pattern and the sixth pattern is a mirror image of the second pattern,
the seventh pattern has a periodic structure in the fifth direction and extends in the sixth direction,
the eighth pattern has a periodic structure in the fifth direction and extends in the seventh direction,
a period in the fifth direction of the periodic structure of the seventh pattern is equal to a period in the fifth direction of the periodic structure of the fourth pattern, and
a period in the fifth direction of the periodic structure of the eighth pattern is equal to the period in the fifth direction of the periodic structure of the third pattern.

14. The imprinting method according to claim 12, wherein
the alignment mark includes a set of a first portion and a second portion provided on one of the original and the substrate and a third portion provided on the other of the original and the substrate are provided,
in a state where the original and the substrate are aligned, the first portion, the third portion, and the second portion are arranged on a straight line in order,
an interval between the first portion and the third portion is equal to an interval between the third portion and the second portion, and
the straight line is parallel to the first direction or the fifth direction.

15. A manufacturing method of a semiconductor device, the method comprising:
preparing a semiconductor substrate on which a to-be-processed film is formed;
dripping or applying a resist onto the to-be-processed film;
performing alignment between an original and the semiconductor substrate using an alignment mark in a state where the original to transfer a pattern onto the resist is brought into proximity with a top of the semiconductor substrate or a state where the original is brought into contact with the resist;
transferring the pattern by imprinting the original onto the resist such that the resist and a surface on a side of the pattern of the original face each other; and
processing the to-be-processed film by using the resist to which the pattern has been transferred as a mask,
wherein the alignment mark is an alignment mark including a combination of a first pattern and a second pattern, one of the patterns being provided on the surface of the original on which the pattern has been formed, the other pattern being provided on a surface of the semiconductor substrate to which the pattern is transferred,
when XY coordinates common to the surface of the original and the surface of the semiconductor substrate are set and the original and the semiconductor substrate face each other in parallel such that directions of the first pattern and the second pattern coincide with each other with respect to the XY coordinates,
the first pattern has a periodic structure in a first direction on the surface of the original or the surface of the semiconductor substrate and extends in a second direction,
the second pattern has a periodic structure in a third direction on the surface of the original or the surface of the semiconductor substrate and extends in a fourth direction,
the first direction and the third direction are parallel to each other,
a period in the first direction of the periodic structure of the first pattern is equal to a period in the third direction of the periodic structure of the second pattern,
at least one of the first pattern and the second pattern has a periodic structure in a fifth direction orthogonal to the first direction and the third direction on the surface of the original or the surface of the semiconductor substrate, and
at least one of the second direction and the fourth direction is oblique with respect to the fifth direction.

16. The manufacturing method of the semiconductor device according to claim 15, wherein
the second direction and the fourth direction are oblique with respect to the fifth direction,
an angle formed by the first direction and the second direction is an acute angle, and
an angle formed by the third direction and the fourth direction is an obtuse angle.

17. The manufacturing method of the semiconductor device according to claim 15, wherein
the first pattern and the second pattern are formed by combining rectangles,
a first side of the rectangle is parallel to the first direction and the third direction,
a second side of the rectangle is orthogonal to the first direction and the third direction, and
the first pattern extends in the second direction as the rectangles adjacent to each other in the fifth direction are arranged to be shifted from each other by a predetermined distance in the first direction, or
the second pattern extends in the fourth direction as the rectangles adjacent to each other in the fifth direction are arranged to be shifted from each other by a predetermined distance in the third direction.

18. The manufacturing method of the semiconductor device according to claim 15, wherein
the alignment mark includes a combination of a third pattern and a fourth pattern is provided, one of the patterns being provided on the surface of the original, the other pattern being provided on the surface of the semiconductor substrate,
the third pattern has a periodic structure in the fifth direction and extends in a sixth direction,
the fourth pattern has a periodic structure in the fifth direction and extends in a seventh direction,
the sixth direction and the seventh direction are parallel to each other, and
a period in the fifth direction of the periodic structure of the third pattern is different from a period in the fifth direction of the periodic structure of the fourth pattern.

19. The manufacturing method of the semiconductor device according to claim 18, wherein
the alignment mark includes
a combination of a fifth pattern provided on the same surface as the first pattern and a sixth pattern provided on the same surface as the second pattern and
a combination of a seventh pattern provided on the same surface as the third pattern and an eighth pattern provided on the same surface as the fourth pattern are provided,
the fifth pattern is a mirror image of the first pattern and the sixth pattern is a mirror image of the second pattern,
the seventh pattern has a periodic structure in the fifth direction and extends in the sixth direction,
the eighth pattern has a periodic structure in the fifth direction and extends in the seventh direction,
a period in the fifth direction of the periodic structure of the seventh pattern is equal to a period in the fifth direction of the periodic structure of the fourth pattern, and
a period in the fifth direction of the periodic structure of the eighth pattern is equal to the period in the fifth direction of the periodic structure of the third pattern.

20. The manufacturing method of the semiconductor device according to claim 18, wherein
the alignment mark includes a set of a first portion and a second portion provided on one of the original and the semiconductor substrate and a third portion provided on the other of the original and the semiconductor substrate are provided, in a state where the original and the semiconductor substrate are aligned, the first portion, the third portion, and the second portion are arranged on a straight line in order, an interval between the first portion and the third portion is equal to an interval between the third portion and the second portion, and the straight line is parallel to the first direction or the fifth direction.

* * * * *